(12) United States Patent
Zin

(10) Patent No.: US 8,435,901 B2
(45) Date of Patent: May 7, 2013

(54) METHOD OF SELECTIVELY ETCHING AN INSULATION STACK FOR A METAL INTERCONNECT

(75) Inventor: Kelvin Zin, Singapore (SG)

(73) Assignee: Tokyo Electron Limited, Tokyo (JP)

( * ) Notice: Subject to any disclaimer, the term of this patent is extended or adjusted under 35 U.S.C. 154(b) by 285 days.

(21) Appl. No.: 12/814,255

(22) Filed: Jun. 11, 2010

(65) Prior Publication Data

US 2011/0306214 A1    Dec. 15, 2011

(51) Int. Cl.
*H01L 21/302* (2006.01)
*H01L 21/461* (2006.01)

(52) U.S. Cl.
USPC .......................................... 438/714; 438/710

(58) Field of Classification Search .......................... None
See application file for complete search history.

(56) References Cited

U.S. PATENT DOCUMENTS

| | | | |
|---|---|---|---|
| 6,103,619 A | 8/2000 | Lai | |
| 6,525,428 B1 | 2/2003 | Ngo et al. | |
| 6,635,185 B2 * | 10/2003 | Demmin et al. | 216/64 |
| 6,949,203 B2 | 9/2005 | Hsieh et al. | |
| 7,102,232 B2 | 9/2006 | Clevenger et al. | |
| 7,297,894 B1 | 11/2007 | Tsukamoto | |
| 7,402,532 B2 | 7/2008 | Clevenger et al. | |
| 7,435,676 B2 | 10/2008 | Dalton et al. | |
| 7,557,328 B2 | 7/2009 | Ohata | |
| 2002/0119677 A1 | 8/2002 | Soda et al. | |
| 2003/0176058 A1 | 9/2003 | Weidman et al. | |
| 2003/0220708 A1 * | 11/2003 | Sahin et al. | 700/121 |
| 2006/0148251 A1 | 7/2006 | Broekaart et al. | |
| 2006/0252195 A1 * | 11/2006 | Dufrenne et al. | 438/199 |
| 2007/0004214 A1 | 1/2007 | Schaller et al. | |
| 2007/0032055 A1 | 2/2007 | Standaert et al. | |
| 2007/0161290 A1 | 7/2007 | Fitzsimmons et al. | |
| 2007/0232048 A1 | 10/2007 | Miyata et al. | |
| 2007/0243714 A1 | 10/2007 | Shin et al. | |
| 2008/0020570 A1 | 1/2008 | Naik | |
| 2008/0073335 A1 | 3/2008 | Tsukamoto | |
| 2008/0083723 A1 | 4/2008 | Tsukamoto et al. | |
| 2008/0083724 A1 * | 4/2008 | Tsukamoto | 219/385 |
| 2008/0254643 A1 * | 10/2008 | Clevenger et al. | 438/778 |
| 2009/0266809 A1 | 10/2009 | Ohata | |
| 2010/0078424 A1 | 4/2010 | Tsukamoto et al. | |

OTHER PUBLICATIONS

International Searching Authority/US, International Search Report and Written Opinion issued in corresponding International Application No. PCT/US11/39224 dated Oct. 6, 2011, 8 pp.

* cited by examiner

*Primary Examiner* — Shamim Ahmed
*Assistant Examiner* — Bradford Gates
(74) *Attorney, Agent, or Firm* — Wood, Herron & Evans, LLP

(57) ABSTRACT

A method of patterning an insulation layer is described. The method includes preparing a film stack on a substrate, wherein the film stack comprises a cap layer, a SiCOH-containing layer overlying the cap layer, and a hard mask overlying the SiCOH-containing layer. The method further includes transferring a pattern through the film stack by performing a series of etch processes in a plasma etching system, wherein the series of etch processes utilize a temperature controlled substrate holder in the plasma etching system according to a substrate temperature control scheme that achieves etch selectivity between the SiCOH-containing layer and the underlying cap layer.

19 Claims, 25 Drawing Sheets

METHOD OF SELECTIVELY ETCHING AN INSULATION STACK FOR A METAL INTERCONNECT

BACKGROUND OF THE INVENTION

1. Field of Invention

The invention relates to a method for selectively etching a pattern in an insulation stack and, in particular, a method for selectively etching a trench-via structure in a low dielectric constant (low-k) insulation stack for subsequent metallization.

2. Description of Related Art

As is known to those in semiconductor device manufacturing, interconnect delay is a major limiting factor in the drive to improve the speed and performance of integrated circuits (IC). One way to minimize interconnect delay is to reduce interconnect capacitance by using low dielectric constant (low-k) materials and ultra-low-k dielectric materials in metal interconnects during back-end-of-line (BEOL) operations for IC production. Such low-k materials presently include organosilicon glass or SiCOH-containing materials.

Thus, in recent years, low-k materials have been developed to replace relatively high dielectric constant insulating materials, such as silicon dioxide. In particular, low-k materials are being utilized for inter-level and intra-level dielectric layers between metal layers of semiconductor devices. Additionally, in order to further reduce the dielectric constant of insulating materials, material films are formed with pores, i.e., porous low-k dielectric materials. Such low-k materials can be deposited by a spin-on dielectric (SOD) method similar to the application of photoresist, or by chemical vapor deposition (CVD). Hence, the use of low-k materials is readily adaptable to existing semiconductor manufacturing processes.

When preparing a new interconnect level on a semiconductor substrate, a cap layer is typically formed overlying the preceding interconnect layer, followed by the formation of the low-k insulation layer and one or more layers, such as a hard mask, overlying the low-k insulation layer. Upon formation of the insulation stack, lithography and etch processing are utilized to pattern the insulation layers in preparation for subsequent metallization processes. For example, the insulation layer stack may be patterned with a trench-via structure according to various integration schemes, including dual damascene integration, when preparing a metal line and contact plug to provide electrical continuity between one interconnect layer and an adjacent interconnect layer.

However, the practical implementation of low-k materials in insulation layer stacks for metal interconnects poses many challenges. One challenge includes selectively patterning the insulation layer stack without damage to the underlying interconnect layer while achieving specified critical dimensions (CDs) for the trench and via structures. During the patterning of the low-k insulation layer, it is essential that the etch process does not prematurely penetrate the underlying cap layer.

SUMMARY OF THE INVENTION

The invention relates to a method for selectively etching a pattern in an insulation stack and, in particular, a method for selectively etching a trench-via structure in a low dielectric constant (low-k) insulation stack for subsequent metallization.

According to one embodiment, a method of patterning an insulation layer is described. The method includes preparing a film stack on a substrate, wherein the film stack comprises a cap layer, a SiCOH-containing layer overlying the cap layer, and a hard mask overlying the SiCOH-containing layer. The method further includes transferring a pattern through the film stack by performing a series of etch processes in a plasma etching system, wherein the series of etch processes utilize a temperature controlled substrate holder in the plasma etching system according to a substrate temperature control scheme that achieves etch selectivity between the SiCOH-containing layer and the underlying cap layer. The substrate temperature control scheme includes: controlling a first substrate temperature in a first etch process for transferring the pattern through the hard mask and optionally for partially transferring the pattern to the SiCOH-containing layer, controlling a second substrate temperature at a temperature greater than the first substrate temperature in a second etch process for transferring the pattern through the SiCOH-containing layer, and controlling a third substrate temperature at a temperature less than the second substrate temperature in a third etch process for transferring the pattern through the cap layer.

According to another embodiment, a method of preparing a trench-via structure on a substrate is described. The method comprises: preparing a film stack on a substrate, the film stack comprising a cap layer, a SiCOH-containing layer overlying the cap layer, and a hard mask overlying the SiCOH-containing layer; forming a trench pattern in the hard mask; preparing a via patterning layer overlying the hard mask with a via pattern aligned with the trench pattern; at least partially transferring the via pattern in the via patterning layer to the SiCOH-containing layer using a first etch process in the plasma etching system; removing the via patterning layer; transferring the trench pattern in the hard mask to the SiCOH-containing layer using a second etch process in the plasma etching system while not penetrating the cap layer; transferring the via pattern in the SiCOH-containing layer to the cap layer using a third etch process in the plasma etching system; and utilizing a temperature controlled substrate holder in the plasma etching system according to a substrate temperature control scheme to achieve etch selectivity between the SiCOH-containing layer and the cap layer during the transferring of the trench pattern. The substrate temperature control scheme includes: controlling a first substrate temperature in the first etch process for transferring the via pattern to the SiCOH-containing layer, controlling a second substrate temperature at a temperature greater than the first substrate temperature in the second etch process for transferring the trench pattern to the SiCOH-containing layer, and controlling a third substrate temperature at a temperature less than the second substrate temperature in the third etch process for transferring the via pattern to the cap layer.

According to yet another embodiment, a method of preparing a trench-via structure on a substrate is described. The method comprises: preparing a film stack on a substrate, the film stack comprising a cap layer, a SiCOH-containing layer overlying the cap layer, and a hard mask overlying the SiCOH-containing layer; forming a via pattern in the hard mask; at least partially transferring the via pattern in the hard mask to the SiCOH-containing layer using a first etch process in the plasma etching system; preparing a trench patterning layer overlying the hard mask with a trench pattern aligned with the via pattern; transferring the trench pattern to the hard mask; removing the trench patterning layer; transferring the trench pattern in the hard mask to the SiCOH-containing layer using a second etch process in the plasma etching system while not penetrating the cap layer; transferring the via pattern in the SiCOH-containing layer to the cap layer using a third etch process in the plasma etching system; and utilizing a temperature controlled substrate holder in the plasma etching system according to a substrate temperature control scheme to achieve etch selectivity between the SiCOH-containing layer and the cap layer during the transferring of the trench pattern. The substrate temperature control scheme includes: controlling a first substrate temperature in the first etch process for transferring the via pattern to the SiCOH-containing layer, controlling a second substrate temperature at a temperature greater than the first substrate temperature in the second etch process for transferring the trench pattern to the SiCOH-containing layer, and controlling a third substrate temperature at a temperature less than the second substrate temperature in the third etch process for transferring the via pattern to the cap layer.

DETAILED DESCRIPTION OF SEVERAL EMBODIMENTS

Figure 1A:
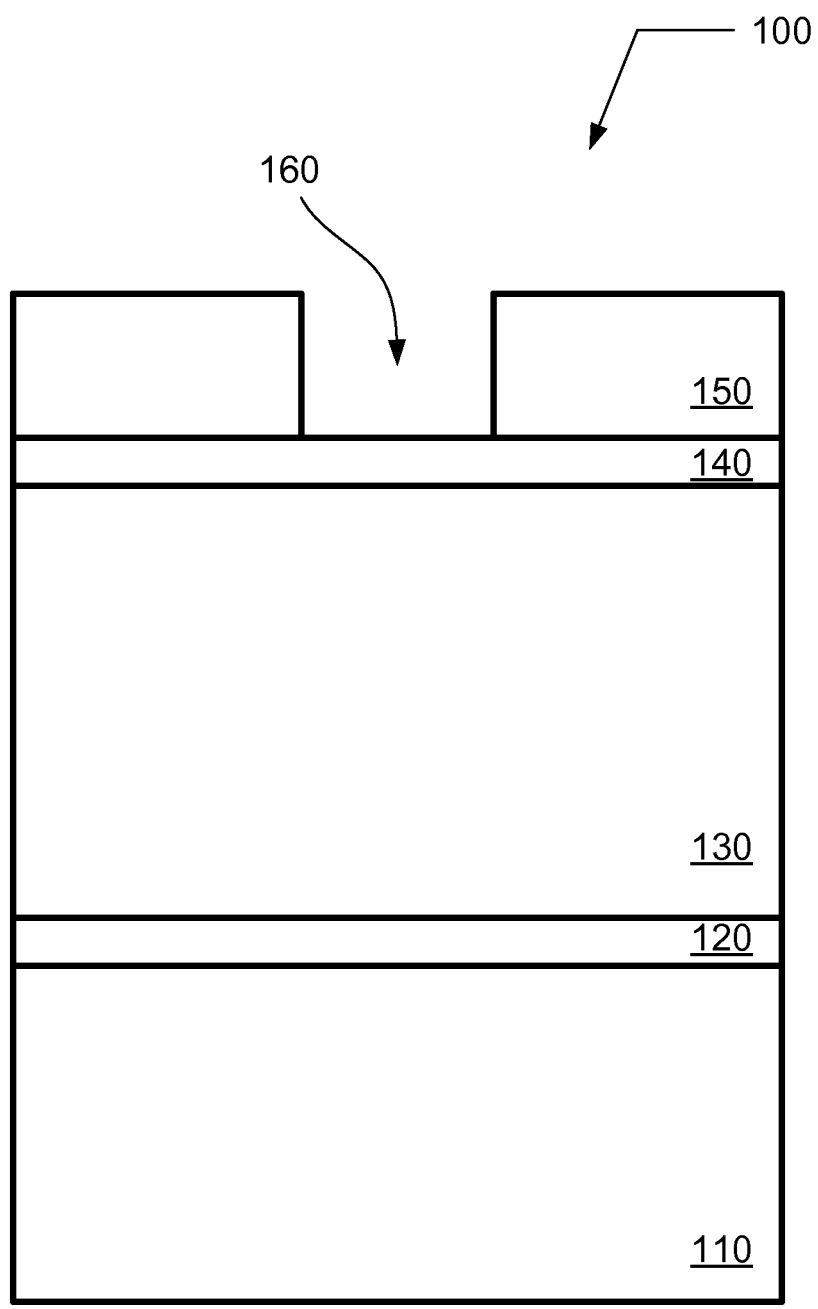
FIGS. 1A through 1E illustrate a schematic representation of a procedure for patterning an insulation layer according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In material processing methodologies, pattern etching can comprise the application of a thin layer of radiation-sensitive material, such as photoresist, to an upper surface of a substrate, followed by patterning of the thin layer of material using lithographic techniques. During pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular constituents of the process gas. Using a series of dry etching processes, the pattern formed in the thin layer of radiation-sensitive material is transferred to the underlying layers within a film stack, including the one or more material layers that are desired for the end product, e.g., an electronic device. However, as described above, the series of dry etching processes must perform according to rigid specifications to achieve properly dimensioned, robust electrical structures in the IC.

Figure 1B:
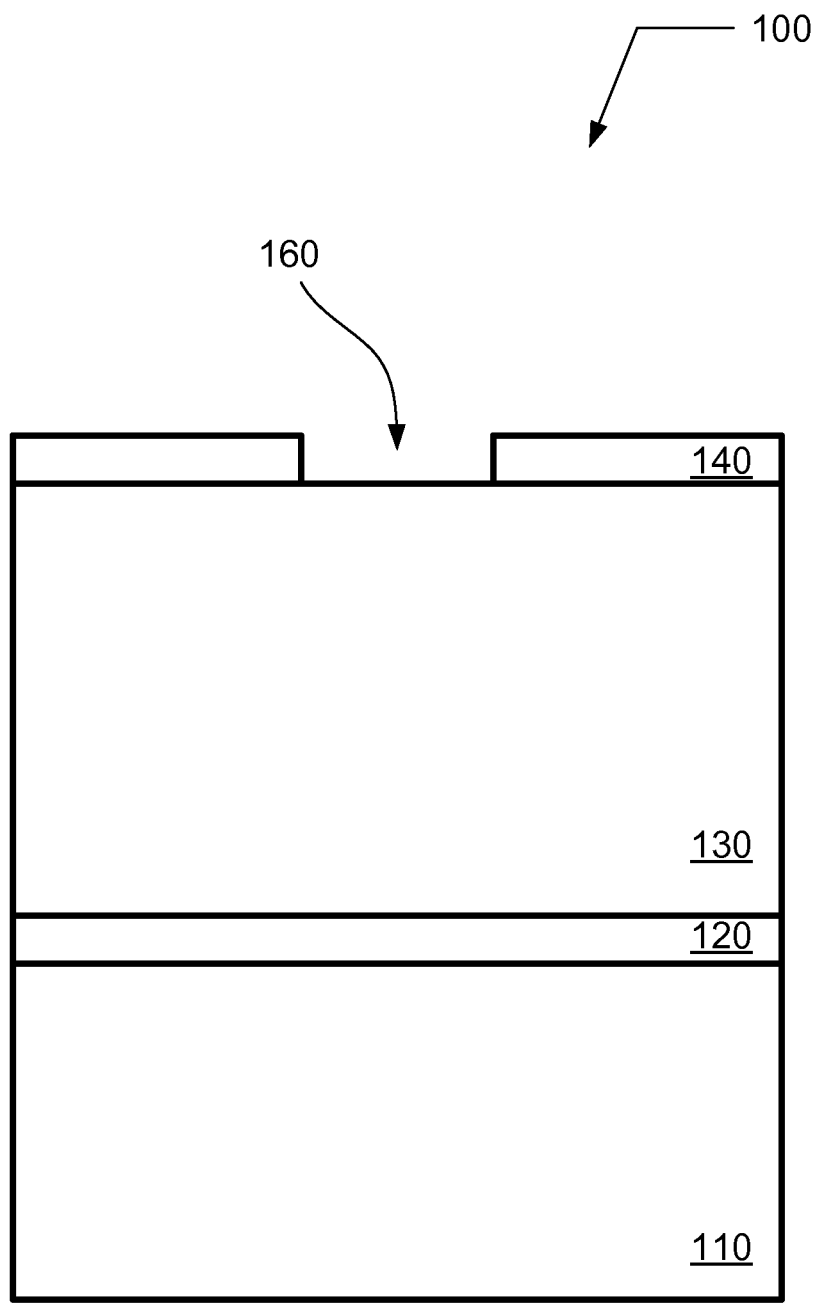
Figure 1C:
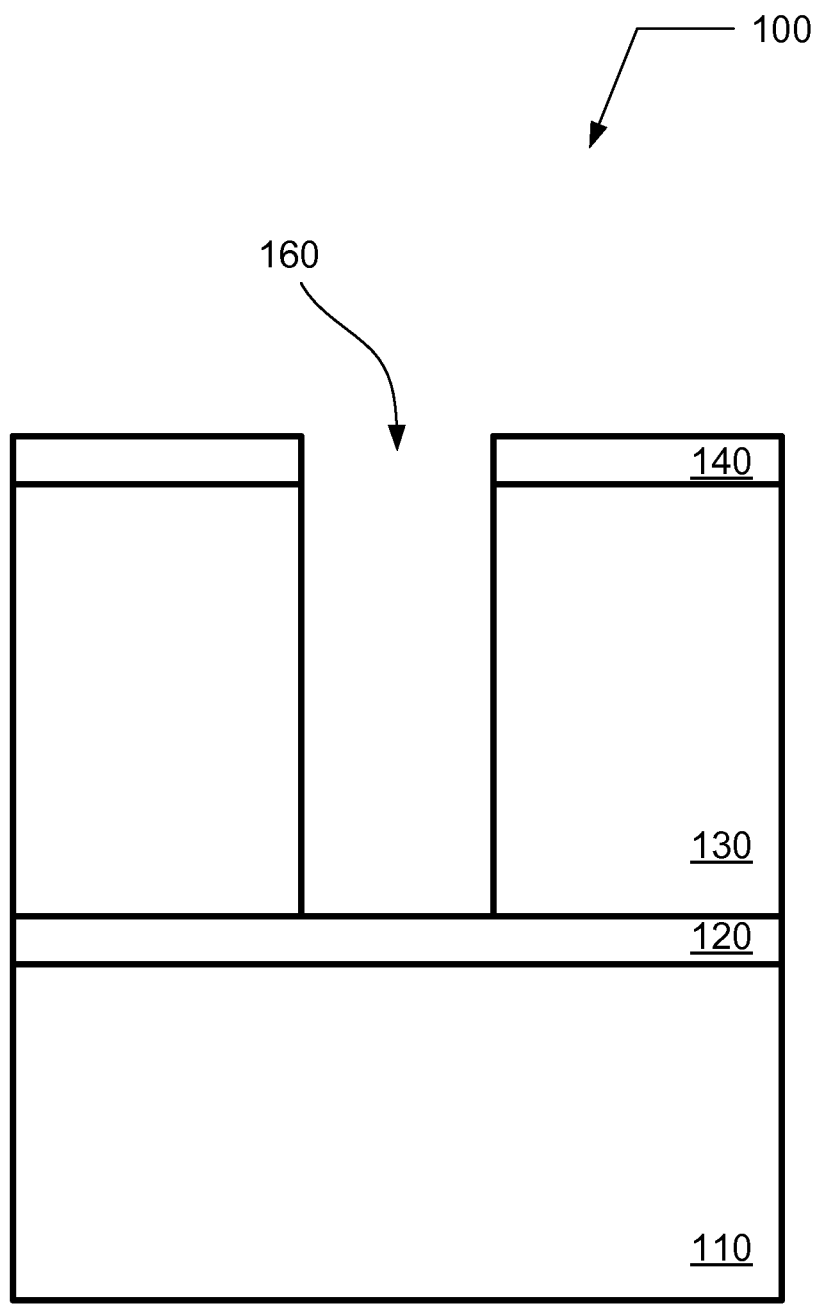
Figure 1D:
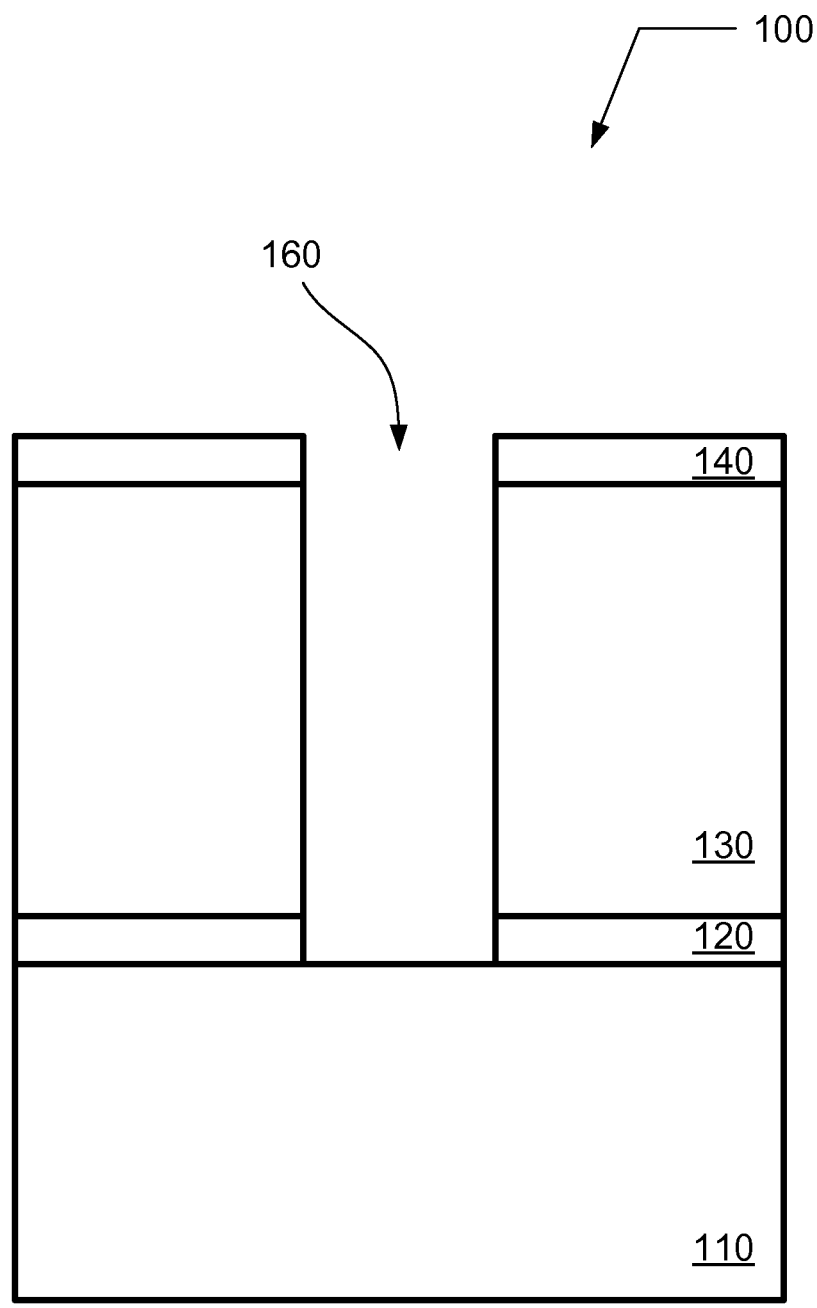
Figure 2:
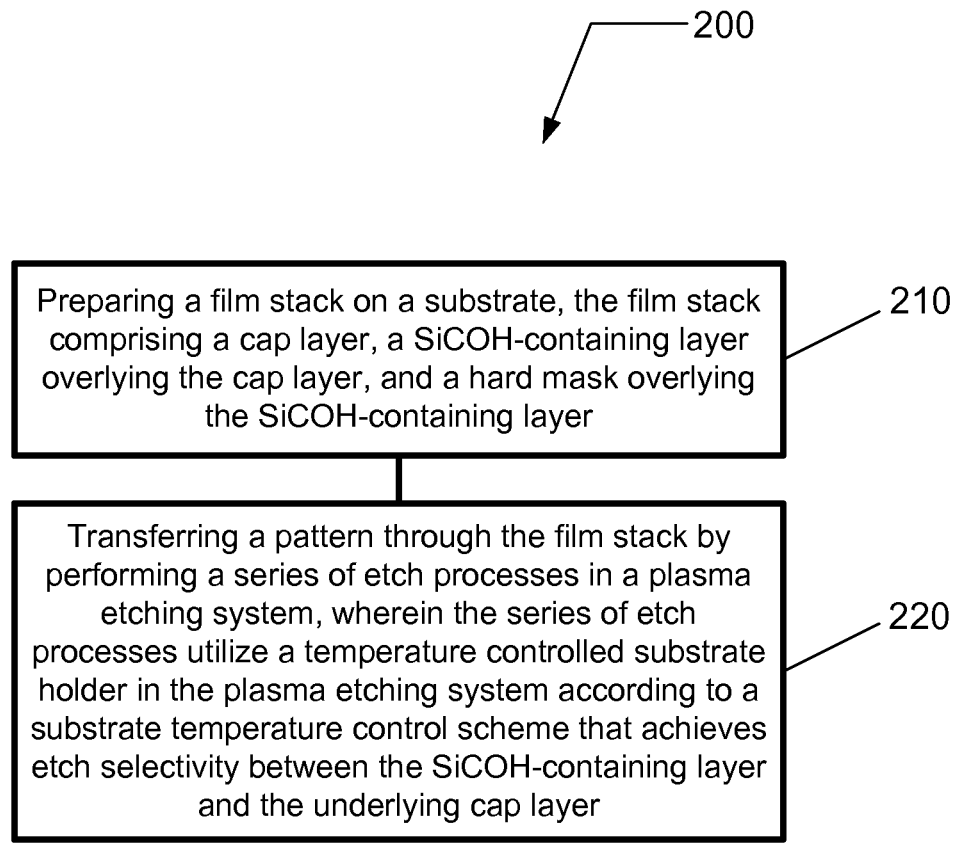
FIG. 2 provides a flow chart illustrating a method of patterning an insulation layer according to another embodiment.

According to an embodiment, a method of patterning a structure on a substrate is schematically illustrated in FIGS. 1A through 1D, and is illustrated in a flow chart 200 in FIG. 2. For example, the structure may include a trench, a via, or a contact. The method begins in 210 with forming a film stack 100 having a plurality of layers (i.e., layers 120 through 150) on a substrate 110. The film stack 100 comprises a cap layer 120, an insulation layer 130 overlying the cap layer 120, and a hard mask 140 overlying the insulation layer 130. Additionally, the film stack 100 comprises a lithographic mask 150 formed on the hard mask 140, wherein a pattern 160, such as a trench pattern, a via pattern, or contact pattern, is formed using lithographic techniques. Although not shown, the film stack 100 may include additional layers.

The insulation layer 130 comprises a dielectric layer that may include a material layer, or plurality of material layers. For instance, the insulation layer 130 may include an organosilicon glass, such as a Si—O—C—H type material, or SiCOH-containing layer having silicon (Si), carbon (C), oxygen (O), and hydrogen (H). Moreover, the insulation layer 130 may comprise a low-k or ultra-low-k dielectric layer having Si, C, O, and H, wherein a nominal dielectric constant value of the insulation layer 130 is less than the dielectric constant of $SiO_2$, which is approximately 4 (e.g., the dielectric constant for thermal silicon oxide can range from 3.8 to 3.9). More specifically, the insulation layer 130 may have a dielectric constant of less than 3.7, or a dielectric constant ranging from 1.6 to 3.7. The insulation layer 130 may be non-porous or porous.

The insulation layer 130 can be formed using a vapor deposition process, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the CLEAN TRACK ACT 8 SOD (spin-on dielectric), ACT 12 SOD, and Lithius coating systems commercially available from Tokyo Electron Limited (TEL). The CLEAN TRACK ACT 8 (200 mm), ACT 12 (300 mm), and LITHIUS (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The cap layer 120 may include a single layer or multiple layers. For example, the cap layer 120 may include a nitrogen doped silicon carbide or Si—N—C—H. Furthermore, for example, the cap layer 120 may include silicon nitride ($SiN_y$), silicon carbide ($SiC_y$), silicon carbonitride ($SiC_xN_y$), or $SiC_xN_yH_z$, or a combination of two or more thereof. The cap layer 120 may include a commercially available material, such as NBLOk. The cap layer 120 can be formed using a vapor deposition process, such as chemical vapor deposition (CVD), or plasma enhanced CVD (PECVD).

Figure 1E:
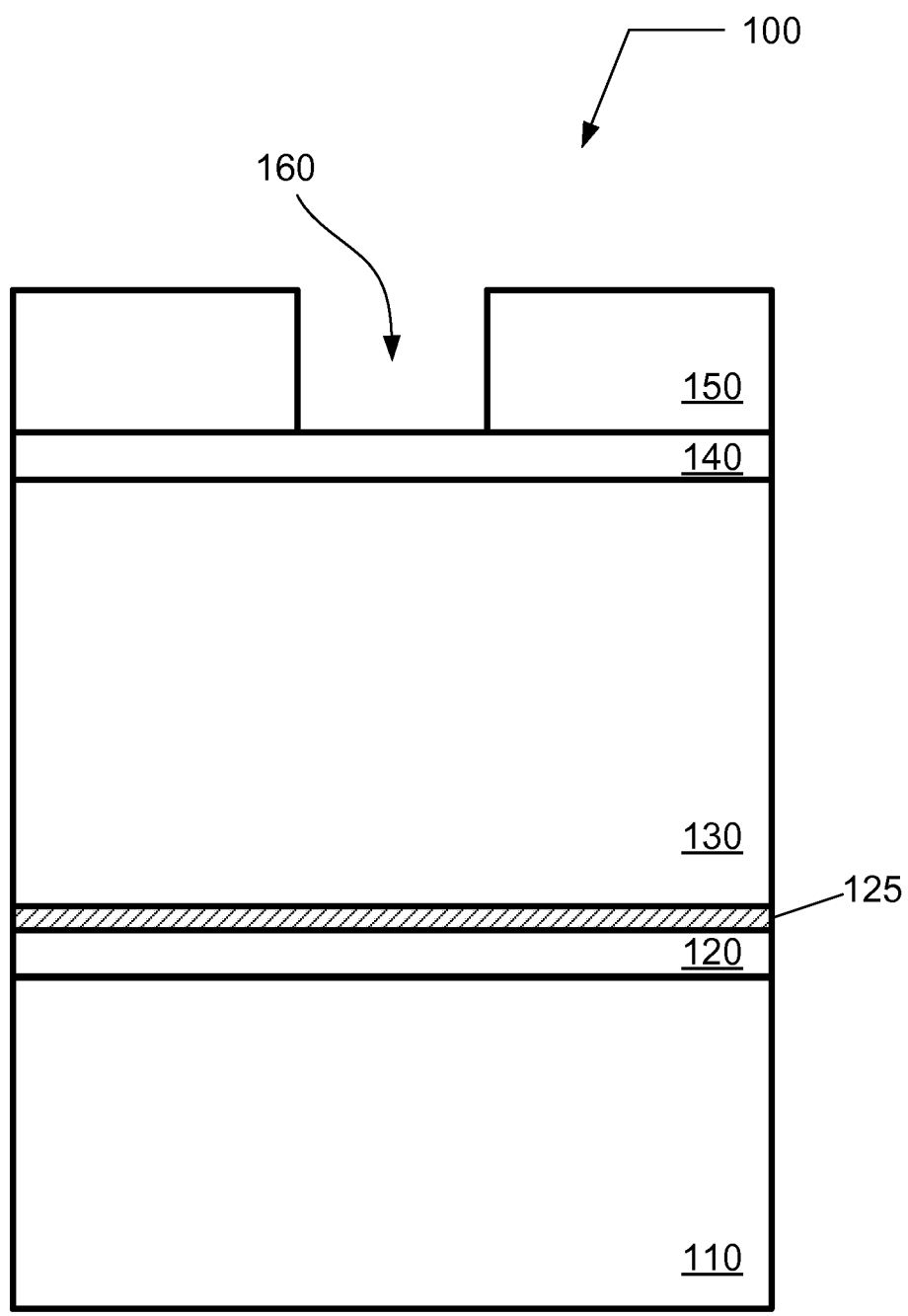

Optionally, as illustrated in FIG. 1E, the film stack 100 may further include a graded layer 125 disposed between the insulation layer 130 and the cap layer 120. The graded layer 125 may serve, among other things, to improve adhesion between the insulation layer 130 and the cap layer 120. For example, the graded layer 125 may include a layer containing Si and one or more elements selected from the group consisting of O, C, and N. The graded layer 125 can be formed using a vapor deposition process, such as chemical vapor deposition (CVD), or plasma enhanced CVD (PECVD). The CVD process may be tailored to grade or vary the composition of the graded layer 125 from top to bottom.

The hard mask 140 may include a single layer or multiple layers. For example, the hard mask 140 may include at least one layer containing Si, or at least one layer containing Si and O, or at least one layer containing a metal. Furthermore, for example, the hard mask 140 may include a metal-containing layer, such as titanium (Ti), titanium nitride ($TiN_y$), tantalum (Ta), tantalum nitride ($TaN_y$), aluminum (Al), or aluminum-copper alloy (Al—Cu), or a dielectric material, such as silicon carbide ($SiC_y$), silicon oxide ($SiO_y$), silicon nitride ($SiN_y$), or silicon oxynitride ($SiO_yN_z$), or amorphous carbon (a-C). The hard mask 140 can be formed using a vapor deposition process, such as chemical vapor deposition (CVD), or plasma enhanced CVD (PECVD).

The lithographic mask 150 may include one or more layers. For example, the lithographic mask 150 may comprise a layer of radiation-sensitive material, such as a light-sensitive material or photoresist, overlying an anti-reflective coating (ARC) layer. Additionally, for example, the lithographic mask 150 may comprise a layer of radiation-sensitive material overlying an ARC layer, which is overlying an optional organic planarization layer (OPL). Alternatively, the lithographic mask 150 may include a bi-layer mask, or multi-layer mask, having an ARC, such as a bottom ARC (BARC) layer, a sacrificial DUO™ layer, or a TERA (tunable etch-resistant ARC) layer, embedded therein.

The layer of radiation-sensitive material may comprise photoresist. For example, the layer of radiation-sensitive material may include 248 nm resists, 193 nm resists, 157 nm resists, EUV resists, or electron sensitive resists. The photoresist layer may be formed using spin-on techniques.

The ARC layer possesses material properties suitable for use as an anti-reflective coating. Additionally, the ARC layer is selected to be compatible with the overlying photoresist layer and the lithographic wavelength, i.e., ArF, KrF, etc. The ARC layer may be formed using vapor deposition techniques or spin-on techniques.

The optional OPL may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

One or more of the layers serving as lithographic mask 150 may be formed using a track system. For example, the track system may comprise a CLEAN TRACK ACT 8, ACT 12, or LITHIUS resist coating and developing system commercially available from Tokyo Electron Limited (TEL). Other systems and methods for forming a photoresist film on a substrate are well known to those skilled in the art of spin-on resist technology. The coating of the photoresist layer may include any or all processes known to those skilled in the art of preparing such films including, but not limited to, performing a cleaning process prior to the coating process, performing a post-application bake (PAB) following the coating process, etc.

As shown in FIG. 1A, pattern 160 is formed in the lithographic mask 150 using lithographic techniques. For example, the lithographic mask 150 may be imaged with an image pattern, and thereafter developed. The exposure to EM radiation is performed in a dry or wet photo-lithography system. The image pattern may be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). If the lithographic mask 150 includes additional layers, such as an ARC layer, then pattern 160 may be transferred to these layers using dry development techniques and/or wet development techniques known to those skilled in the art of bi-layer, tri-layer, etc., mask development.

Thereafter, in 220, as shown in FIGS. 1B through 1D, and FIG. 2, the pattern 160 formed in lithographic mask 150 is transferred through the film stack 100 using a series of etch processes in a plasma etching system. The series of etch processes utilize a temperature controlled substrate holder in the plasma etching system according to a substrate temperature control scheme that achieves etch selectivity between the insulation layer 130, e.g., the SiCOH-containing layer, and the underlying cap layer 120.

As shown in FIG. 1B, pattern 160 is transferred through the hard mask 140 using a first etch process. Optionally, pattern 160 may be partially transferred to the insulation layer 130 during the first etch process. The first etch process may include a dry etching process or a wet etching process. The etching process may include a dry plasma etching process or dry non-plasma etching process. When utilizing a dry plasma etching process, the plasma etch gas composition may include a halogen-containing chemistry. For example, the plasma etch gas composition may include $Cl_2$, $BCl_3$, $Br_2$, HBr, $SF_6$, or $NF_3$, or any combination of two or more thereof. Additionally, for example, the plasma etch gas composition may include a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., or a combination of two or more thereof. Furthermore, additive gases may include an inert gas, such as a noble gas, oxygen, hydrogen, nitrogen, $CO_2$, or CO, or two or more thereof. Alternatively, as would be understood by one skilled in the art of dry plasma etching, any etching process chemistry can be employed that selectively etches the hard mask 140 relative to the lithographic mask 150.

Referring still to FIG. 1B, following the transfer of pattern 160 to the hard mask 140, the lithographic mask 150 may be removed. However, it is not necessary that the lithographic mask 150 be removed. The lithographic mask 150 may be removed using a wet or dry stripping/ashing process.

Figure 10:
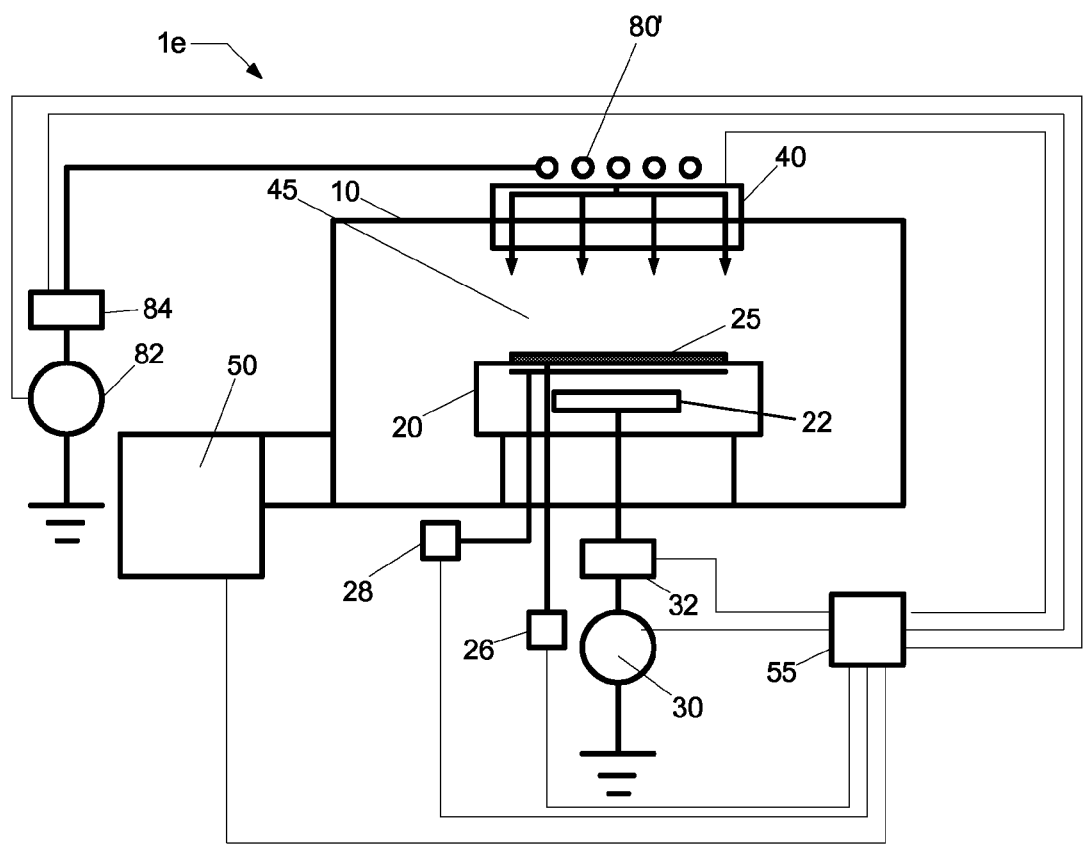
FIG. 10 shows a schematic representation of a plasma etching system according to another embodiment.

As shown in FIG. 10, pattern 160 is transferred from the hard mask 140 through the insulation layer 130 using a second etch process. The second etch process may include a dry etching process or a wet etching process. The etching process may include a dry plasma etching process or dry non-plasma etching process. When utilizing a dry plasma etching process, the plasma etch gas composition may include a halogen-containing chemistry. For example, the plasma etch gas composition may include $Cl_2$, $BCl_3$, $Br_2$, HBr, $SF_6$, or $NF_3$, or any combination of two or more thereof. Additionally, for example, the plasma etch gas composition may include a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., or a combination of two or more thereof. Furthermore, additive gases may include an inert gas, such as a noble gas, oxygen, hydrogen, nitrogen, $CO_2$, or CO, or two or more thereof. Alternatively, as would be understood by one skilled in the art of dry plasma etching, any etching process chemistry can be employed that selectively etches the insulation layer 130 relative to the other layers including the hard mask 140 and the cap layer 120.

As shown in FIG. 1D, pattern 160 is transferred from the insulation layer 130 through the cap layer 120 using a third etch process. The third etch process may include a dry etching process or a wet etching process. The etching process may include a dry plasma etching process or dry non-plasma etching process. When utilizing a dry plasma etching process, the plasma etch gas composition may include a halogen-containing chemistry. For example, the plasma etch gas composition may include $Cl_2$, $BCl_3$, $Br_2$, HBr, $SF_6$, or $NF_3$, or any combination of two or more thereof. Additionally, for example, the plasma etch gas composition may include a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., or a combination of two or more thereof. Furthermore, additive gases may include an inert gas, such as a noble gas, oxygen, hydrogen, nitrogen, $CO_2$, or CO, or two or more thereof. Alternatively, as would be understood by one skilled in the art of dry plasma etching, any etching process chemistry can be employed that selectively etches the cap layer 120 relative to the other layers including the hard mask 140 and the insulation layer 130.

The inventor has discovered that the hard mask 140, the insulation layer 130, and the cap layer 120 may be etched using the above described series of etch processes. With these etch processes, acceptable profile control, including control of critical dimension (CD), may be achieved at relatively low substrate temperatures, e.g., a substrate temperature of about 20 degrees C. (Celsius) or less. However, at these relatively low temperatures, the series of etch processes readily etches through these layers with marginal selectivity to one another. For instance, when completing the patterning of the insulation layer 130 using an etch process at relatively low substrate temperature, the pattern 160 penetrates the cap layer 120, which may be undesirable.

Therefore, the series of etch processes are performed according to the aforementioned substrate temperature control scheme. The substrate temperature control scheme includes: (i) controlling a first substrate temperature in the first etch process for transferring the pattern 160 through the hard mask 140 and optionally to the insulation layer 130 in part; (ii) controlling a second substrate temperature at a temperature greater than the first substrate temperature in the second etch process for transferring the pattern 160 through the insulation layer 130; and (iii) controlling a third substrate temperature at a temperature less than the second substrate temperature in the third etch process for transferring the pattern 160 to the cap layer 120. The inventor has found that the substrate temperature control scheme achieves etch selectivity between the insulation layer 130, e.g., the SiCOH-containing layer, and the underlying cap layer 120.

As an example, the substrate temperature control scheme includes: (a) controlling the first substrate temperature at a temperature less than about 50 degrees C. in the first etch process; (b) controlling the second substrate temperature at a temperature greater than about 50 degrees C. in the second etch process; and (c) controlling the third substrate temperature at a temperature less than about 50 degrees C. in the third etch process.

As another example, the substrate temperature control scheme includes: (a) controlling the first substrate temperature at a temperature less than about 30 degrees C. in the first etch process; (b) controlling the second substrate temperature at a temperature greater than about 50 degrees C. in the second etch process; and (c) controlling the third substrate temperature at a temperature less than about 30 degrees C. in the third etch process.

As another example, the substrate temperature control scheme includes: (a) controlling the first substrate temperature at a temperature less than about 20 degrees C. in the first etch process; (b) controlling the second substrate temperature at a temperature greater than about 50 degrees C. in the second etch process; and (c) controlling the third substrate temperature at a temperature less than about 20 degrees C. in the third etch process.

As yet another example, the substrate temperature control scheme includes: (a) controlling the first substrate temperature at a temperature less than about 10 degrees C. in the first etch process; (b) controlling the second substrate temperature at a temperature greater than about 50 degrees C. in the second etch process; and (c) controlling the third substrate temperature at a temperature less than about 10 degrees C. in the third etch process.

In one embodiment, the series of etch processes described above for patterning film stack 100 in FIGS. 1A through 1D, and FIG. 2, may be utilized within a trench-first-metal-hardmask (TFMHM) integration scheme for dual damascene metal interconnect fabrication. In an alternate embodiment, the series of etch processes described above for patterning film stack 100 in FIGS. 1A through 1D, and FIG. 2, may be utilized within a via-first-trench-last (VFTL) integration scheme for dual damascene metal interconnect fabrication.

As will be described in greater detail below, the substrate temperature control scheme is executed using the aforementioned temperature controlled substrate holder in the plasma etching system. The temperature controlled substrate holder comprises a support base having fluid channels to circulate a temperature controlled thermal fluid in the support base, and a substrate support coupled via a thermal insulator to an upper portion of the support base. The substrate support further comprises one or more heating elements embedded within the substrate support, an upper surface to support the substrate by contact between the upper surface and a backside of the substrate, and an electrostatic clamp electrode to hold the substrate on the upper surface of the substrate support. The one or more heating elements may comprise a first heating element located at a substantially central region of the substrate and a second heating element located at a substantially edge region of the substrate, wherein the first heating element and the second heating element are concentrically arranged.

Additionally, the temperature controlled substrate holder may include a backside gas supply system configured to supply a heat transfer gas to the backside of the substrate through at least one of a plurality of orifices or channels disposed on the upper surface of the substrate support. The orifices of the backside gas supply system may be arranged in a plurality of zones on the upper surface of the substrate support to vary a backside pressure in a radial direction between a substantially central region of the backside of the substrate and a substantially edge region of the backside of the substrate. For example, the plurality of zones for controlling the supply of heat transfer gas to the backside of the substrate may correspond to the regions where the first and second heating elements are located.

Using the temperature controlled substrate holder in the plasma etching system, the substrate temperature control scheme for the series of etch processes may include: (i) maintaining the substrate at a first temperature profile during the first etch process by controlling the substrate support at a first set-point temperature comprising a first inner set-point temperature corresponding to the substantially central region and a first outer set-point temperature corresponding to the substantially edge region, and controlling the support base at a first base temperature; (ii) adjusting the substrate from the first temperature profile to a second temperature profile following the first etch process and preceding the second etch process; (iii) maintaining the substrate at the second temperature profile during the second etch process by controlling the substrate support at a second set-point temperature comprising a second inner set-point temperature and a second outer set-point temperature, the second inner set-point temperature and the second outer set-point temperature being different than the first inner set-point temperature and the first outer set-point temperature, and controlling the support base at a second base temperature; (iv) adjusting the substrate from the second temperature profile to a third temperature profile following the second etch process and preceding the third etch process; and (v) maintaining the substrate at the third temperature profile during the third etch process by controlling the substrate support at a third set-point temperature comprising a third inner set-point temperature and a third outer set-point temperature, the third inner set-point temperature and the third outer set-point temperature being different than the second inner set-point temperature and the second outer set-point temperature, and controlling the support base at a third base temperature.

The process pressure may be varied between the first etch process, the second etch process, and/or the third etch process, or it may be kept constant between two or more processes. Additionally, power for generating plasma may be varied between the first etch process, the second etch process, and/or the third etch process, or it may be kept constant between two or more processes. Furthermore, the first etch process, the second etch process, and/or the third etch process may proceed for a time duration sufficient to etch partially or fully through each layer in the film stack. The time duration may be determined in-situ using endpoint detection or it may be determined prior to performing each etch process.

Referring now to FIGS. 3A through 3F, a method of preparing a trench-via structure on a substrate is illustrated according to an embodiment. The method for preparing the trench-via structure may include a trench-first-metal-hardmask (TFMHM) integration scheme for dual damascene metal interconnect fabrication. As shown in FIGS. 3A through 3F, the trench-via structure is formed through a film stack 300. Thereafter, the trench-via structure is lined with one or more conformal thin films, wherein the one or more conformal thin films include a metal barrier layer, a metal adhesion layer, or a metal seed layer, or any combination of two or more thereof. After the liner is formed, the trench-via structure is filled with metal, such as Cu, and planarized using, for example, chemical-mechanical planarization (CMP) to form a metal interconnect and achieve electrical contact to a metal line 312 in substrate 310.

Figure 3A:
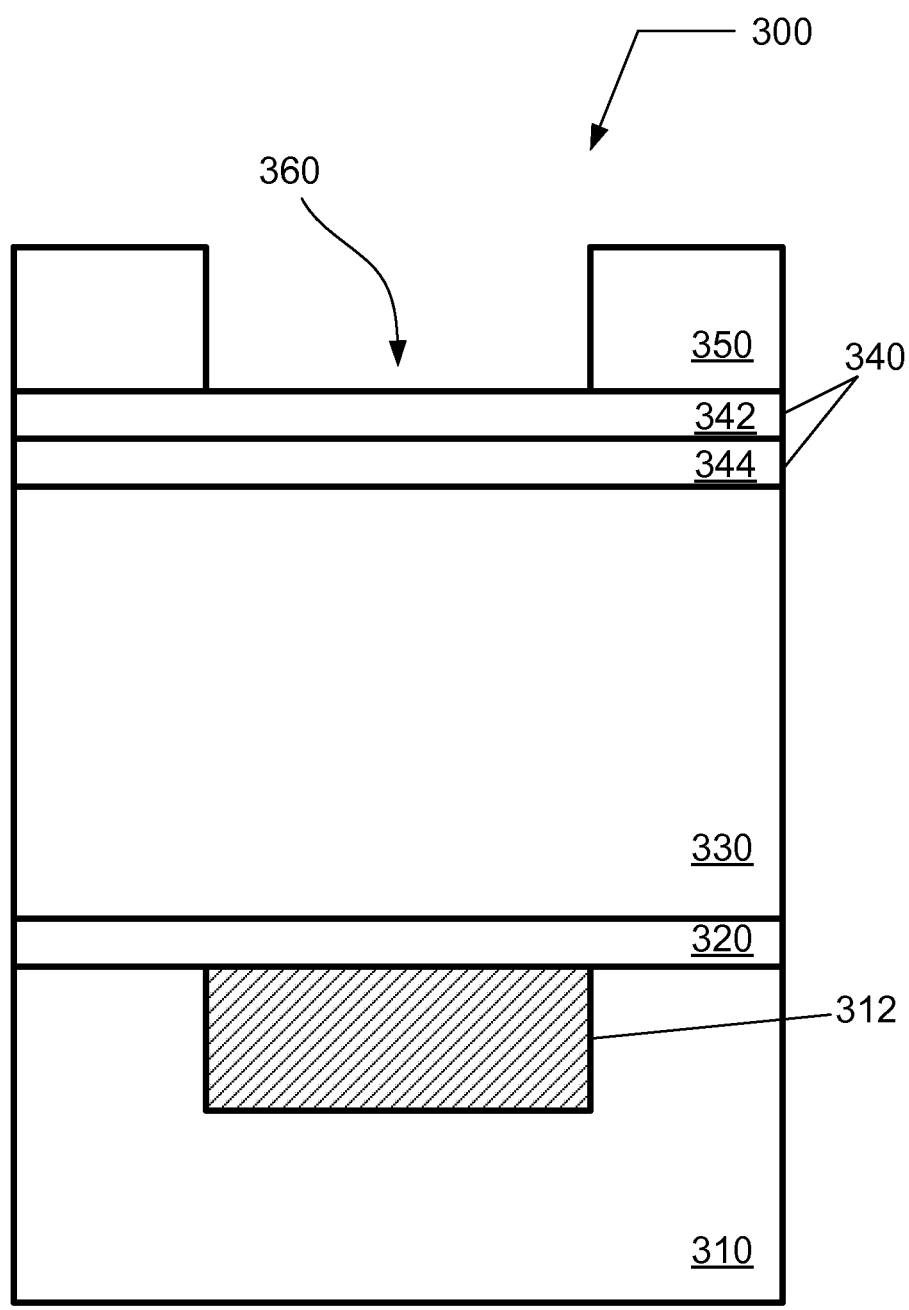
FIGS. 3A through 3F illustrate a schematic representation of a procedure for preparing a trench-via structure on a substrate according to another embodiment.

Referring to FIG. 3A, the film stack 300 is formed on substrate 310, wherein the film stack 300 comprises a cap layer 320, a SiCOH-containing layer 330 overlying the cap layer 320, and a hard mask 340 overlying the SiCOH-containing layer 330. As discussed above, the hard mask 340 may include multiple layers, such as a metal hard mask layer 342 and a silicon-containing layer 344.

Figure 3B:
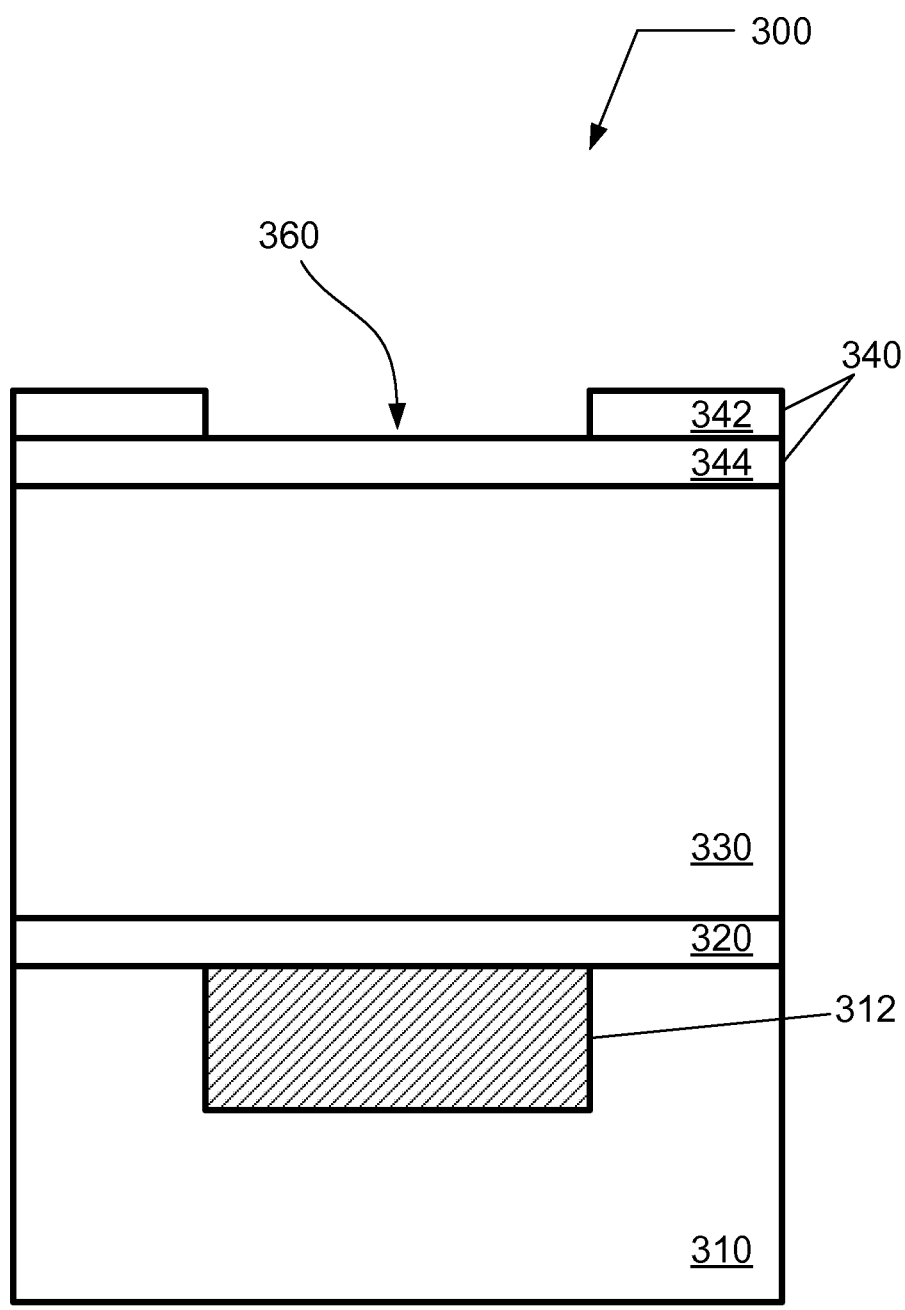

Using lithographic techniques, a first mask 350 (or trench patterning layer) is prepared having a trench pattern 360 formed therein. As shown in FIG. 3B, the trench pattern 360 in the first mask 350 is transferred to the metal hard mask layer 342 via an etching process, and the first mask 350 is removed.

Figure 3C:
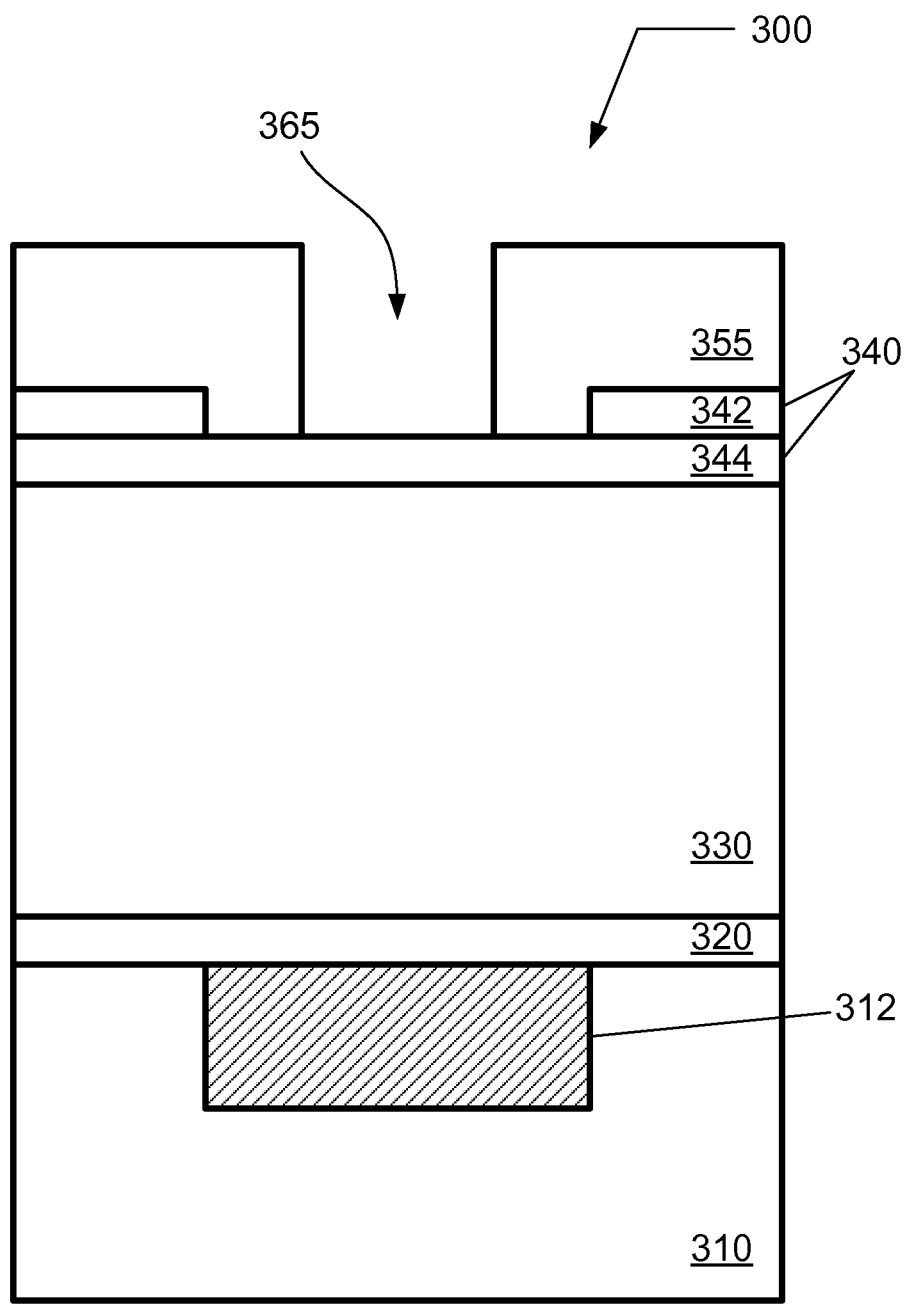
Figure 3D:
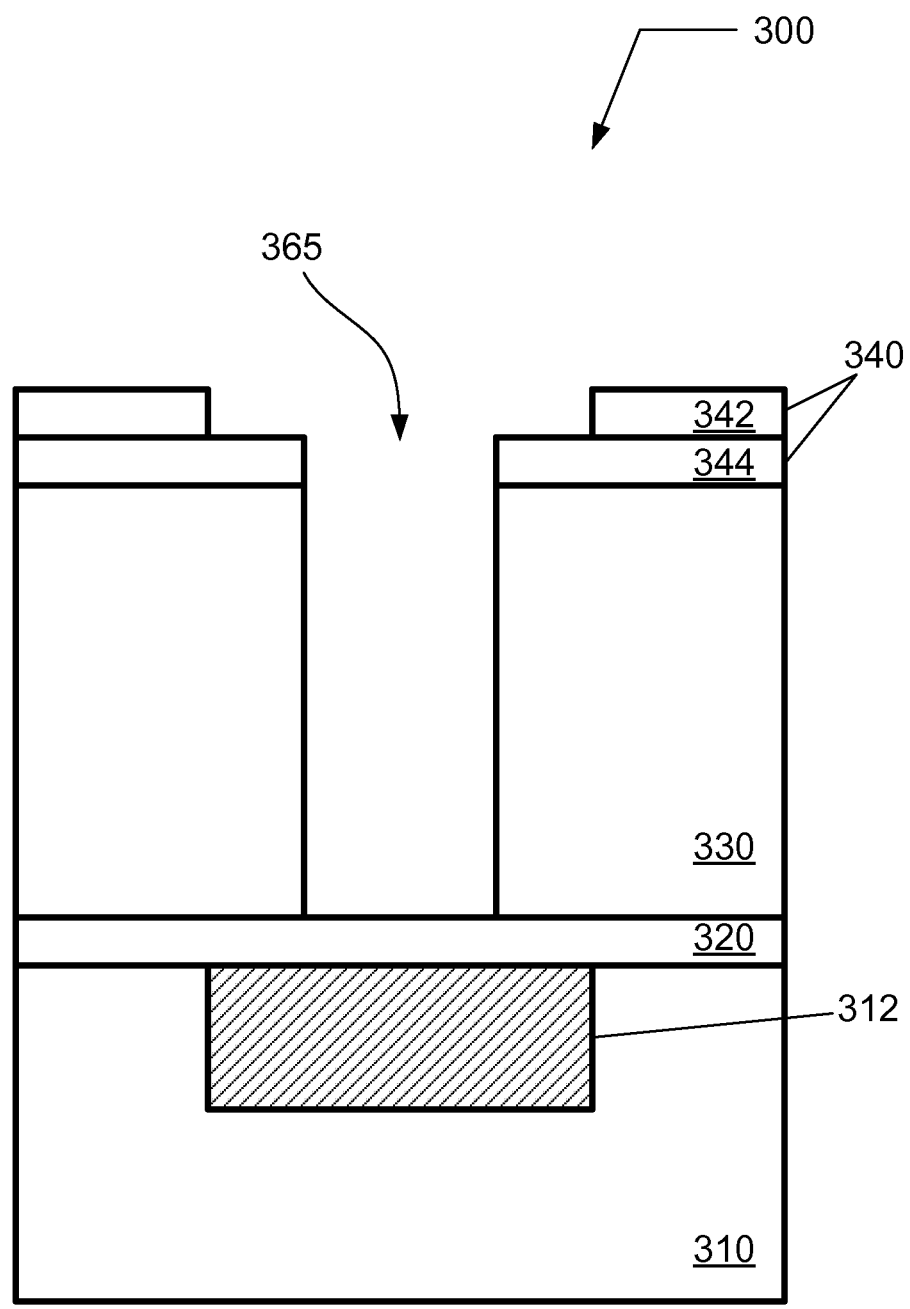

Referring to FIG. 3C, a second mask 355 (or via patterning layer) is prepared having a via pattern 365 formed therein. The via pattern 365 is aligned with the trench pattern 360. As shown in FIG. 3D, the via pattern 365 is at least partially transferred from the second mask 355 to the SiCOH-containing layer 330 using a first etch process in the plasma etching system. Thereafter, the second mask 355 is removed.

Figure 3E:
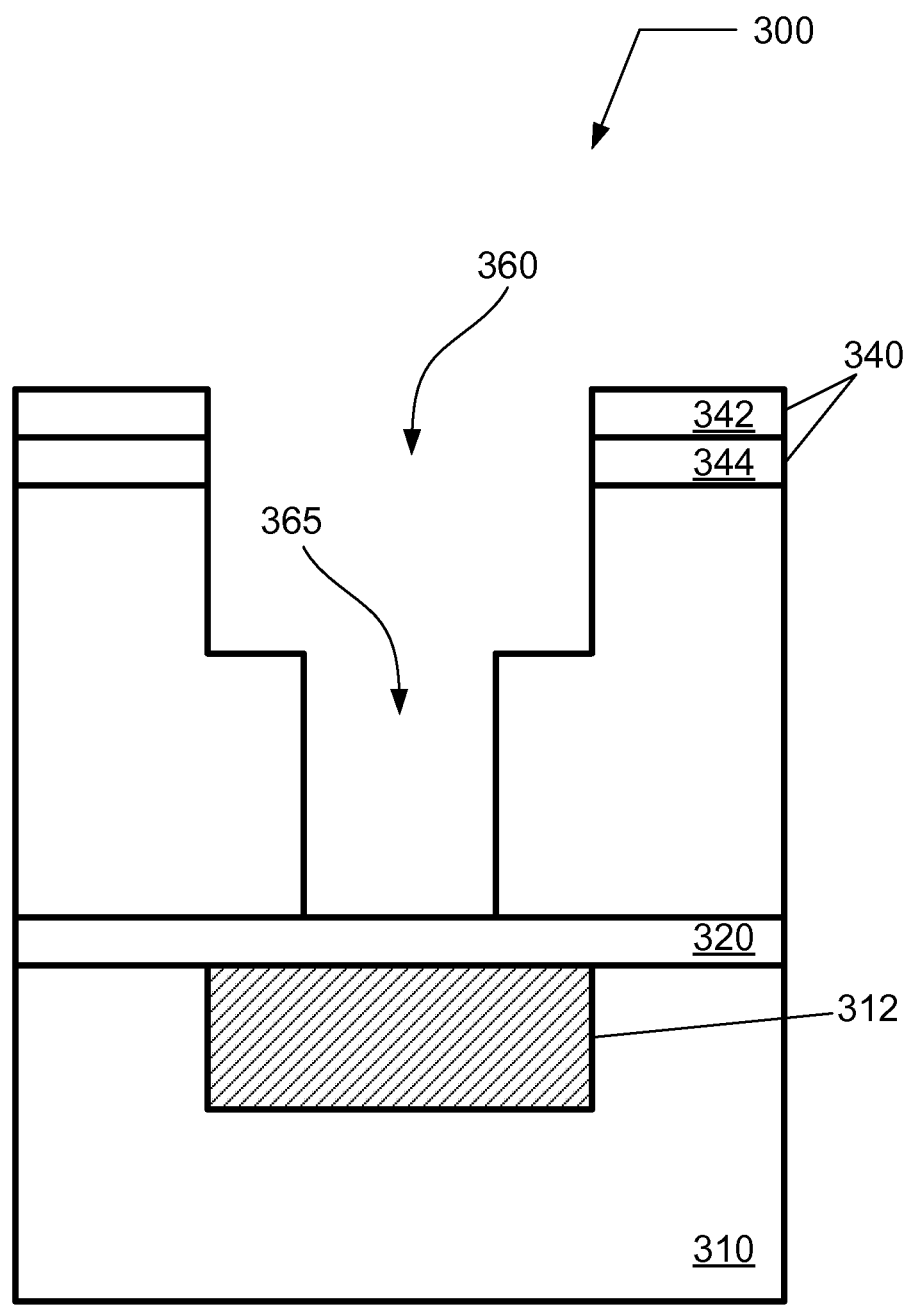

Referring to FIG. 3E, the trench pattern 360 in the metal hard mask layer 342 is transferred to silicon-containing layer 344 and the SiCOH-containing layer 330 using a second etch process in the plasma etching system while not penetrating the cap layer 320.

Figure 3F:
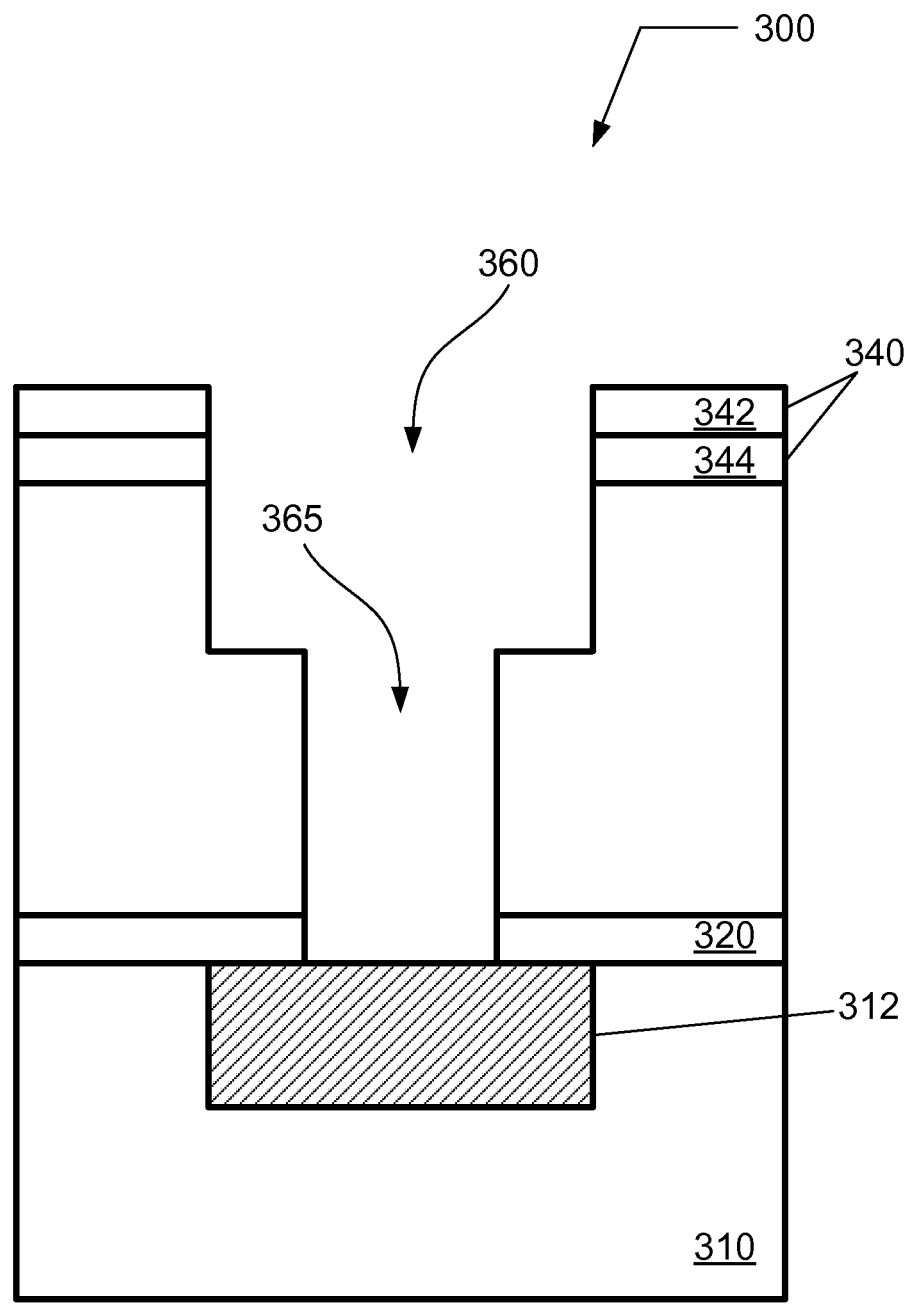

Then, referring to FIG. 3F, the via pattern 365 in the SiCOH-containing layer 330 is transferred to the cap layer 320 using a third etch process in the plasma etching system. During the series of etch processes, i.e., the first etch process, the second etch process, and the third etch process, a temperature controlled substrate holder is utilized in the plasma etching system according to a substrate temperature control scheme to achieve etch selectivity between the SiCOH-containing layer 330 and the cap layer 320 during the transferring of the trench pattern 360.

The substrate temperature control scheme includes: controlling a first substrate temperature in the first etch process step for transferring the via pattern 365 at least partially into the SiCOH-containing layer 330, controlling a second substrate temperature at a temperature greater than the first substrate temperature in the second etch process step for transferring the trench pattern 360 to the SiCOH-containing layer 330, and controlling a third substrate temperature at a temperature less than the second substrate temperature in the third etch process step for transferring the via pattern 365 to the cap layer 320.

Referring now to FIGS. 4A through 4E, a method of preparing a trench-via structure on a substrate is illustrated according to an embodiment. The method for preparing the trench-via structure may include a via-first-trench-last (VFTL) integration scheme for dual damascene metal interconnect fabrication. As shown in FIGS. 4A through 4E, the trench-via structure is formed through a film stack 400. Thereafter, the trench-via structure is lined with one or more conformal thin films, wherein the one or more conformal thin films include a metal barrier layer, a metal adhesion layer, or a metal seed layer, or any combination of two or more thereof. After the liner is formed, the trench-via structure is filled with metal, such as Cu, and planarized using, for example, chemical-mechanical planarization (CMP) to form a metal interconnect and achieve electrical contact to a metal line 412 in substrate 410.

Figure 4A:
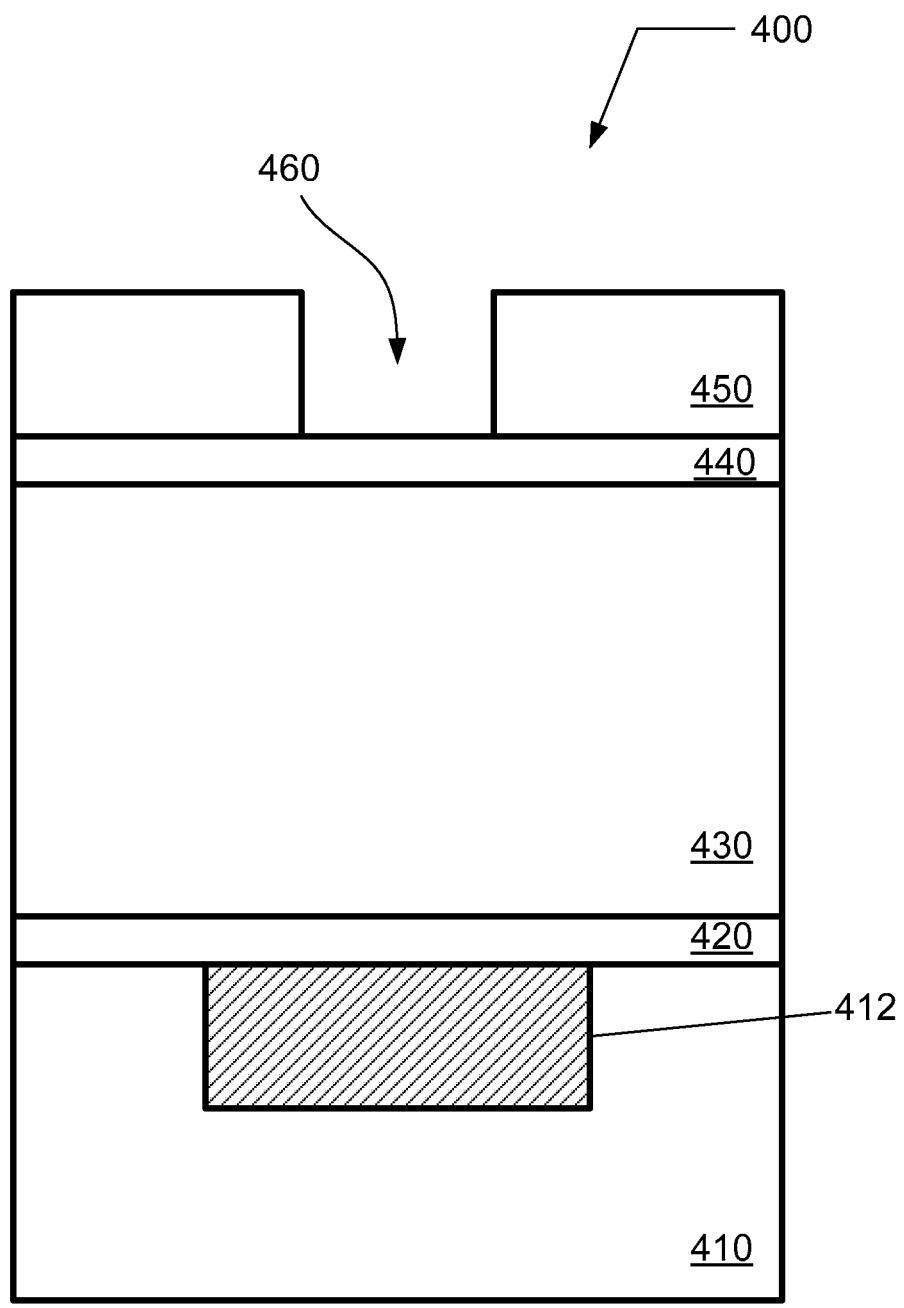
FIGS. 4A through 4E illustrate a schematic representation of a procedure for preparing a trench-via structure on a substrate according to another embodiment.

Referring to FIG. 4A, the film stack 400 is formed on substrate 410, wherein the film stack 400 comprises a cap layer 420, a SiCOH-containing layer 430 overlying the cap layer 420, and a hard mask 440 overlying the SiCOH-containing layer 430.

Figure 4B:
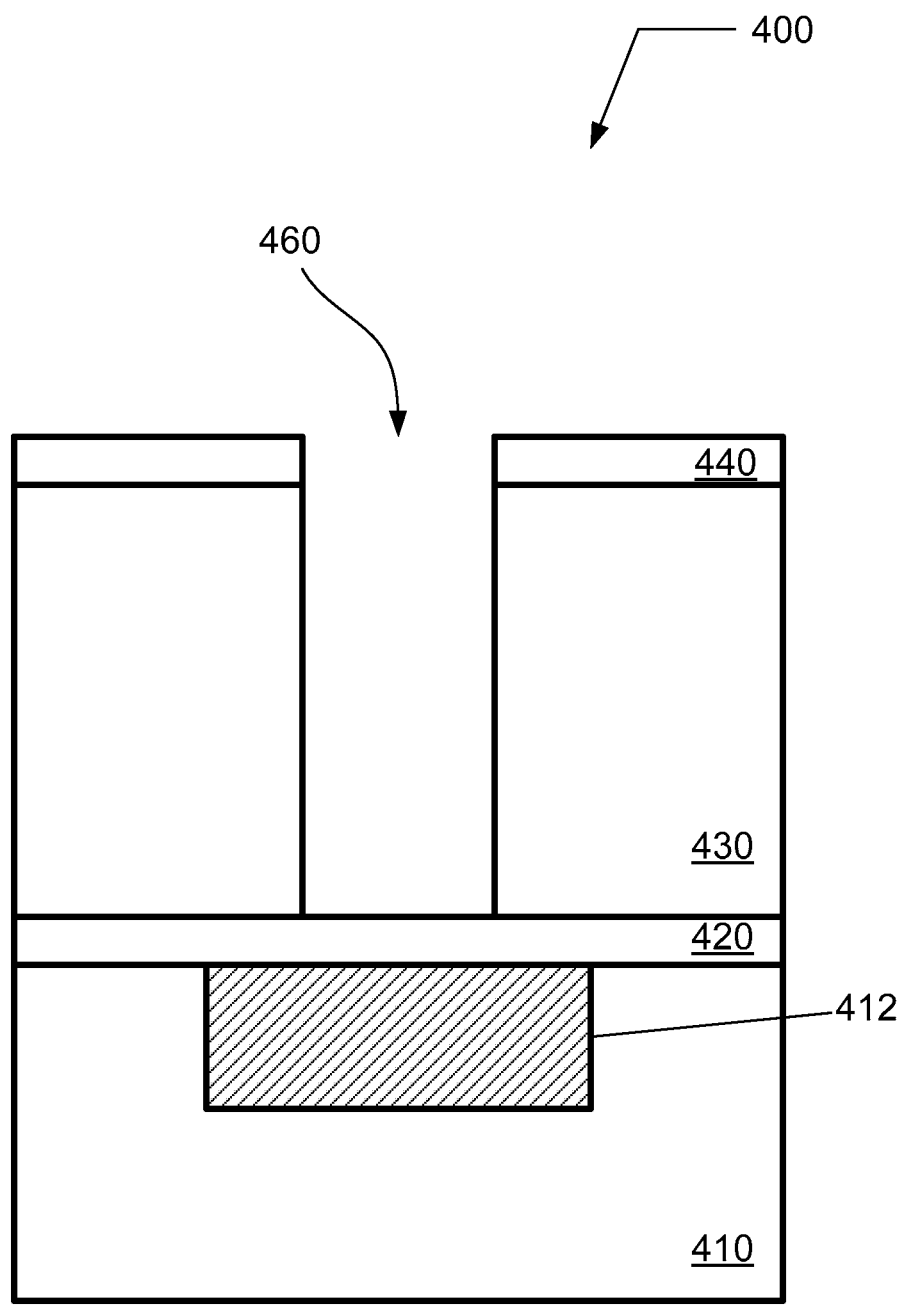

Using lithographic techniques, a first mask 450 (or via patterning layer) is prepared having a via pattern 460 formed therein. As shown in FIG. 4B, the via pattern 460 in the first mask 450 is transferred to the hard mask 440 via an etching process, and the first mask 450 is removed.

Referring still to FIG. 4B, the via pattern 460 in hard mask 440 is at least partially transferred to the SiCOH-containing layer 430 using a first etch process in the plasma etching system.

Figure 4C:
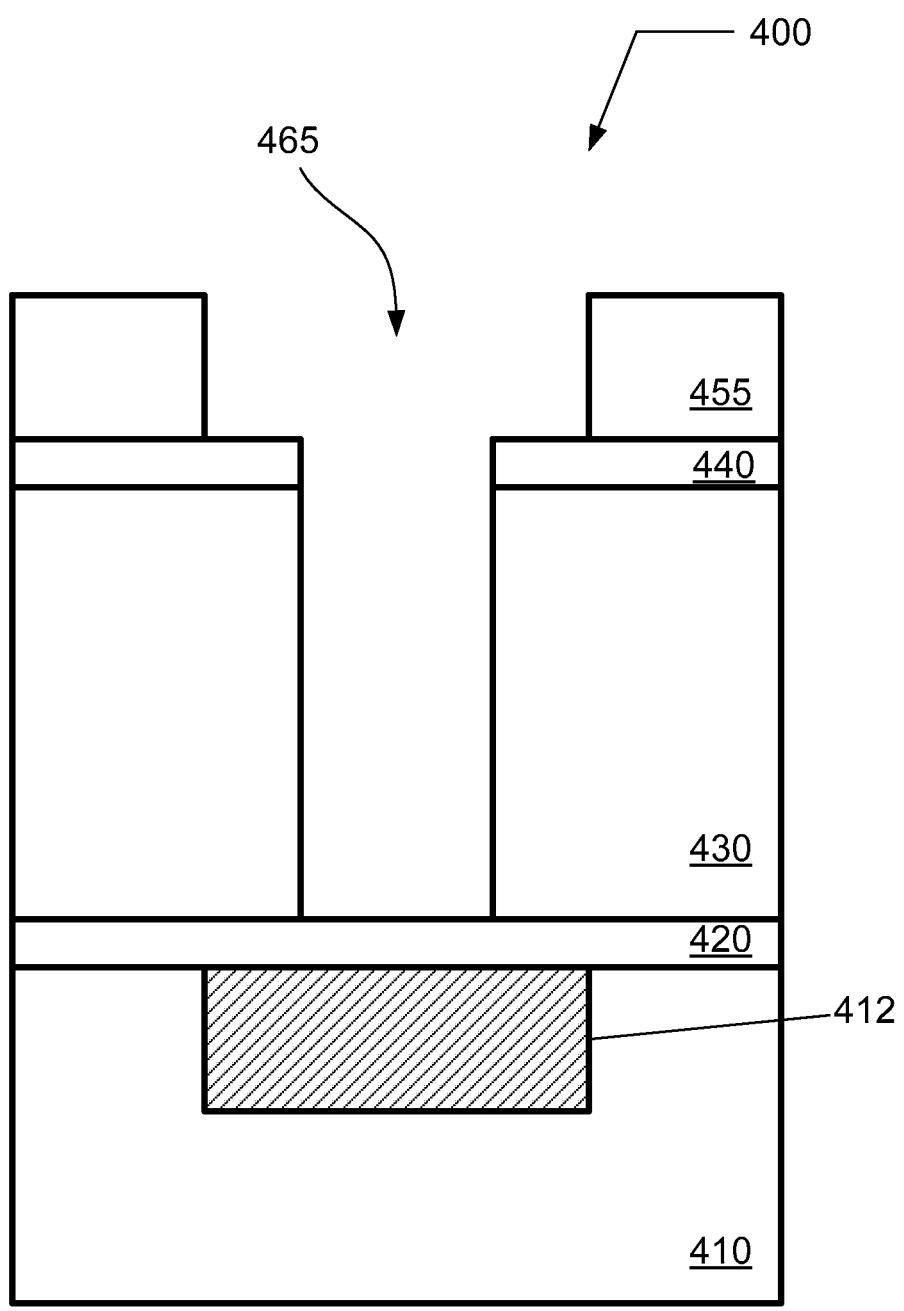
Figure 4D:
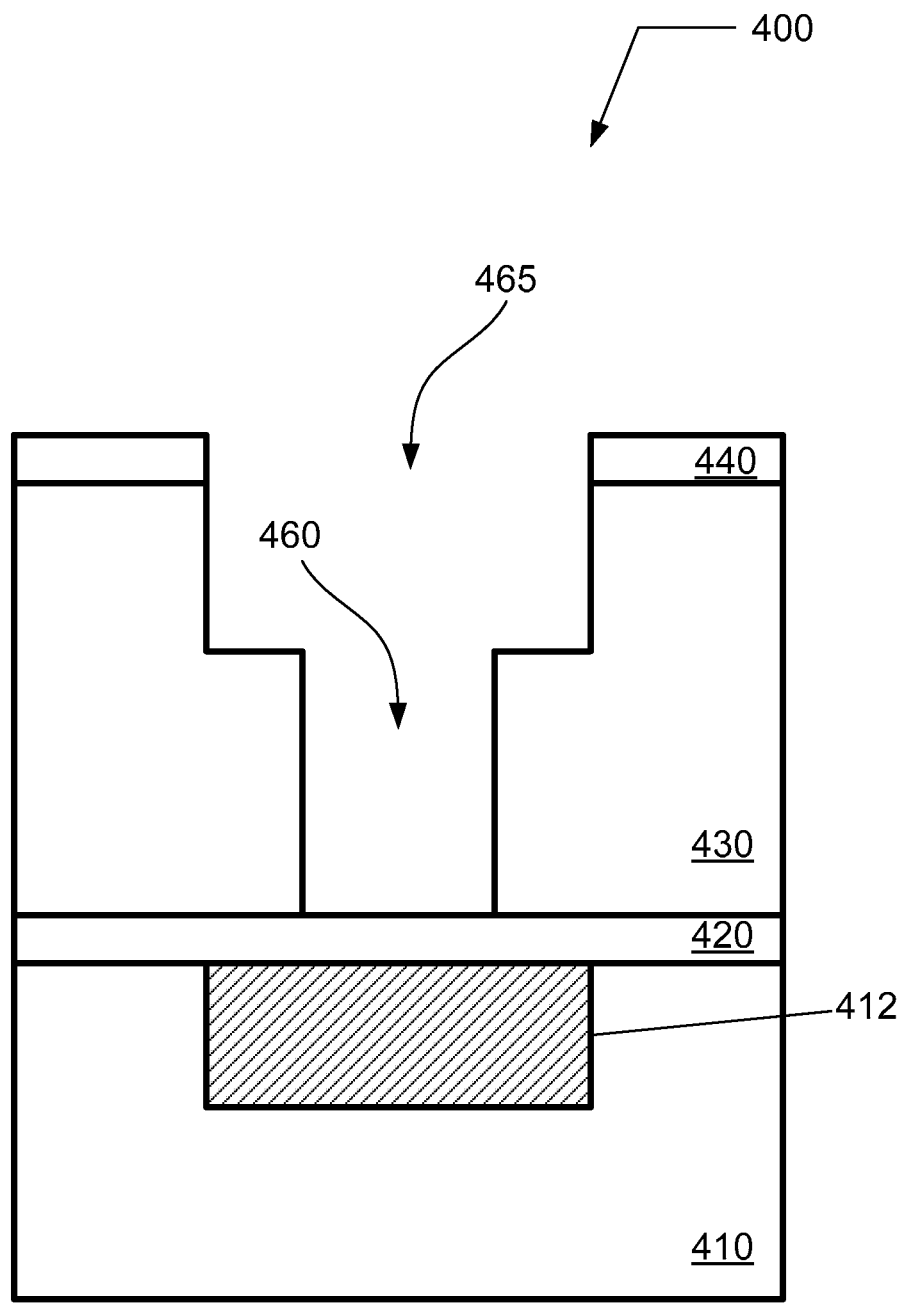

Referring to FIG. 4C, a second mask 455 (or trench patterning layer) is prepared having a trench pattern 465 formed therein. The trench pattern 465 is aligned with the via pattern 460. As shown in FIG. 4D, the trench pattern 465 is transferred from the second mask 455 to the hard mask 440, and the second mask 455 is removed.

Referring to FIG. 4D, the trench pattern 465 in hard mask 440 is transferred to the SiCOH-containing layer 430 using a second etch process in the plasma etching system while not penetrating the cap layer 420.

Figure 4E:
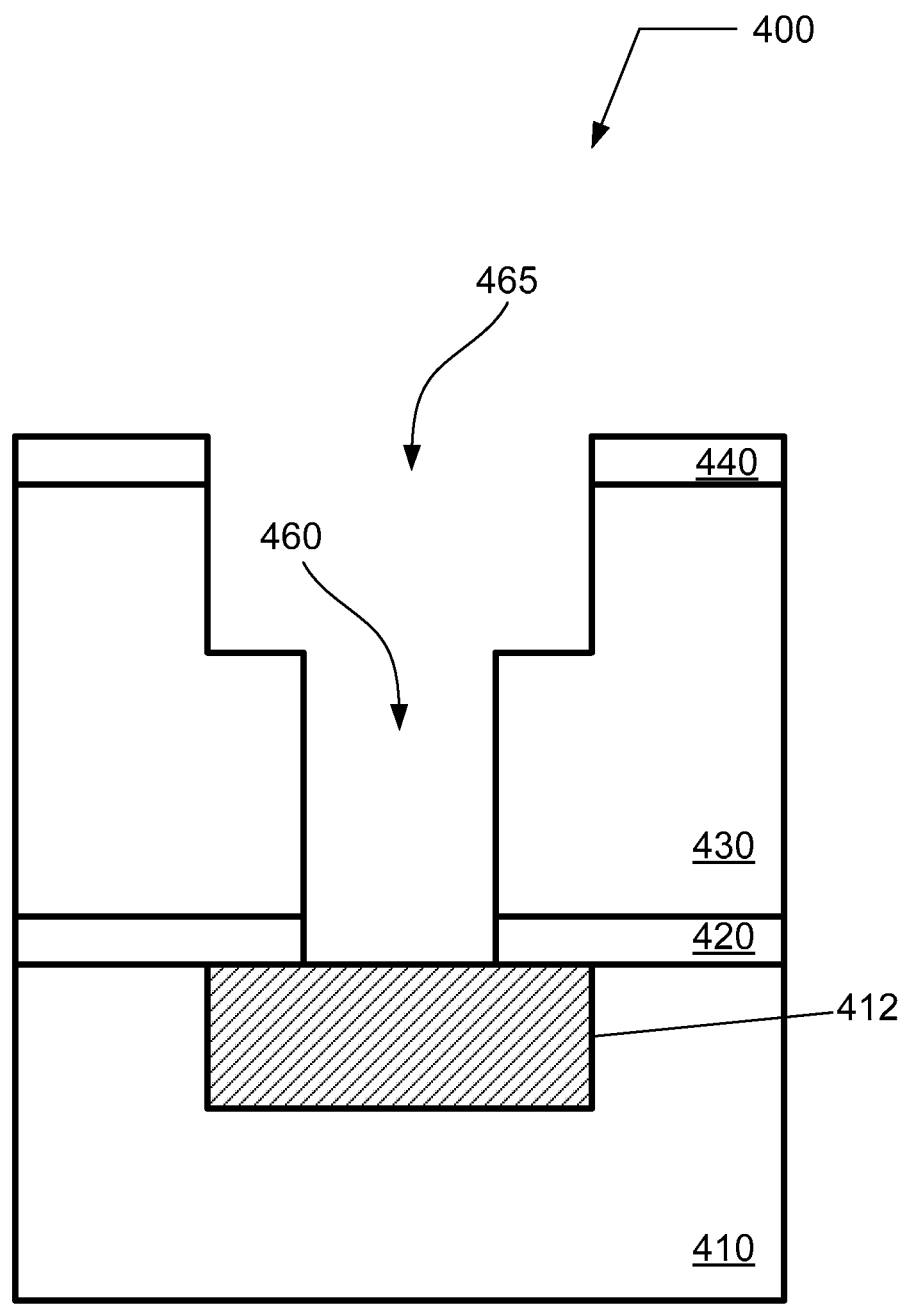

Then, referring to FIG. 4E, the via pattern 460 in the SiCOH-containing layer 430 is transferred to the cap layer 420 using a third etch process in the plasma etching system. During the series of etch processes, i.e., the first etch process, the second etch process, and the third etch process, a temperature controlled substrate holder is utilized in the plasma etching system according to a substrate temperature control scheme to achieve etch selectivity between the SiCOH-containing layer 430 and the cap layer 420 during the transferring of the trench pattern 465.

The substrate temperature control scheme includes: controlling a first substrate temperature in the first etch process for transferring the via pattern 460 at least partially to the SiCOH-containing layer 430, controlling a second substrate temperature at a temperature greater than the first substrate temperature in the second etch process for transferring the trench pattern 465 to the SiCOH-containing layer 430, and controlling a third substrate temperature at a temperature less than the second substrate temperature in the third etch process for transferring the via pattern 460 to the cap layer 420.

One or more of the etch processes described above may be performed utilizing a plasma etching system such as the one described in FIGS. 5 through 11. Furthermore, one or more of the etch processes described above may be performed utilizing a temperature controlled substrate holder in a plasma etching system such as the one described in FIG. 12.

Figure 5:
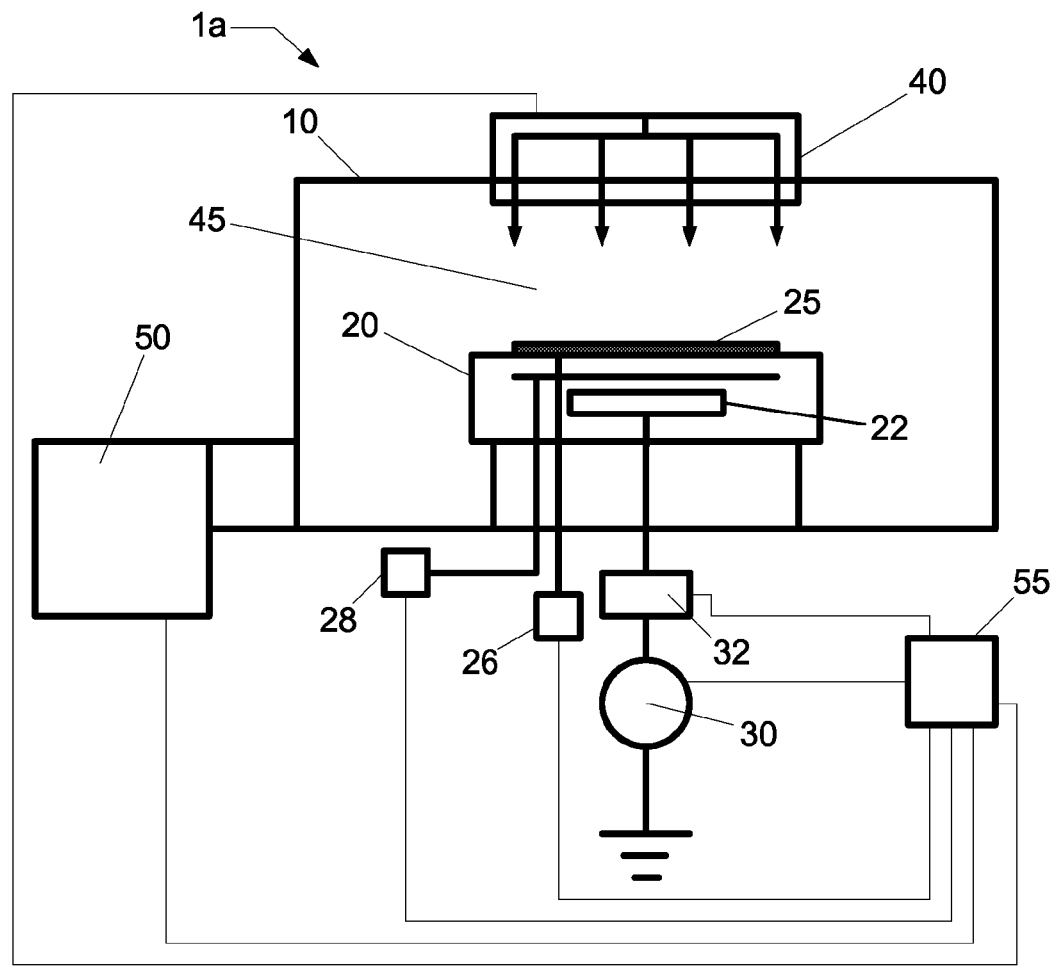
FIG. 5 shows a schematic representation of a plasma etching system according to an embodiment.

According to one embodiment, a plasma etching system 1a configured to perform the above identified process conditions is depicted in FIG. 5 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma etching system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma etching system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 5, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10.

Controller 55 comprises a microprocessor, memory, and a digital I/O port capable of generating control voltages sufficient to communicate and activate inputs to plasma etching system 1a as well as monitor outputs from plasma etching system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma etching system 1a according to a process recipe in order to perform a plasma assisted process on substrate 25.

Controller 55 can be locally located relative to the plasma etching system 1a, or it can be remotely located relative to the plasma etching system 1a. For example, controller 55 can exchange data with plasma etching system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 6, plasma etching system 1b can be similar to the embodiment of FIG. 5 and further comprise either a stationary, or mechanically or electrically rotating magnetic field system 60, in order to potentially increase plasma density and/or improve plasma processing uniformity, in addition to those components described with reference to FIG. 5. Moreover, controller 55 can be coupled to magnetic field system 60 in order to regulate the speed of rotation and field strength. The design and implementation of a rotating magnetic field is well known to those skilled in the art.

Figure 6:
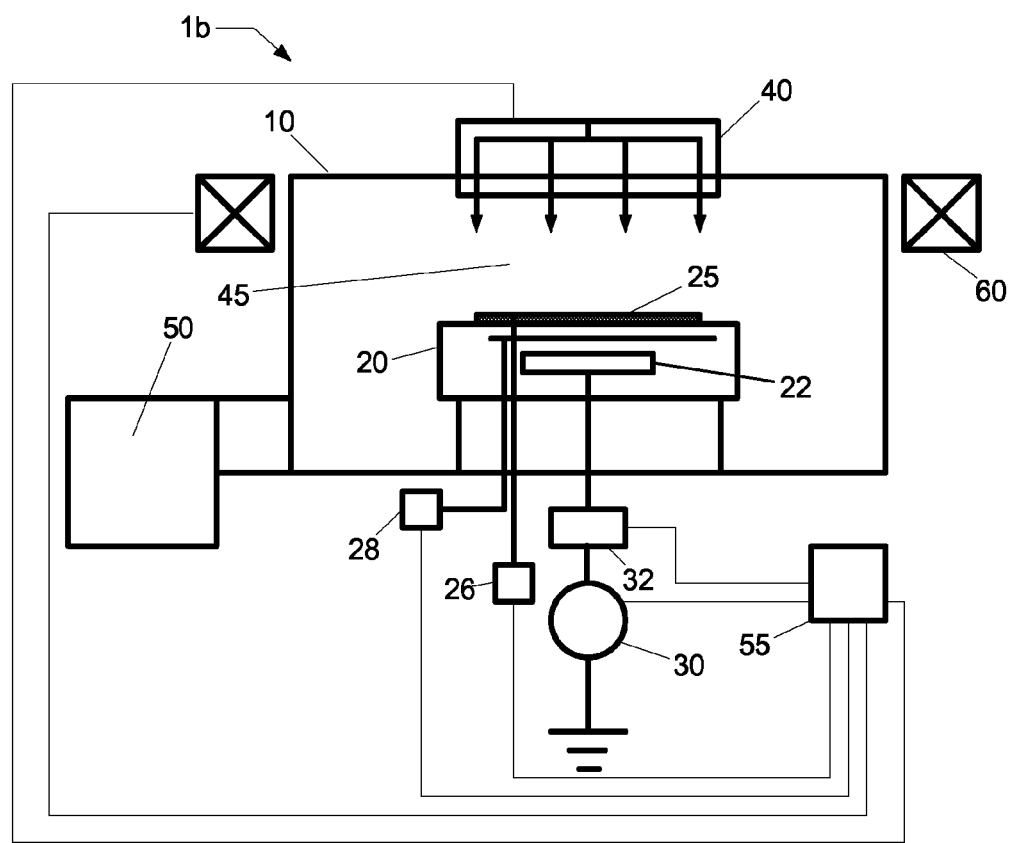
FIG. 6 shows a schematic representation of a plasma etching system according to another embodiment.
Figure 7:
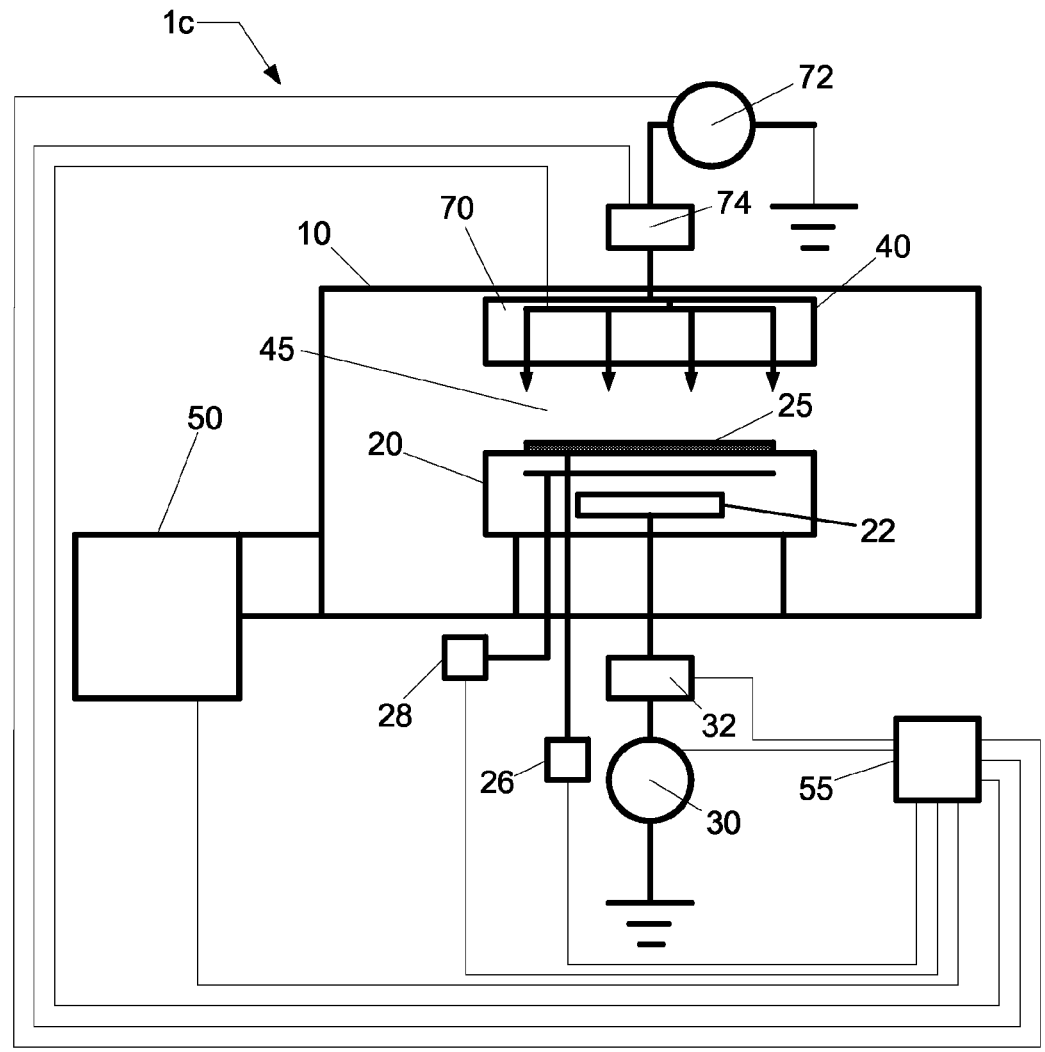
FIG. 7 shows a schematic representation of a plasma etching system according to another embodiment.

In the embodiment shown in FIG. 7, plasma etching system 1c can be similar to the embodiment of FIG. 5 or FIG. 6, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 8:
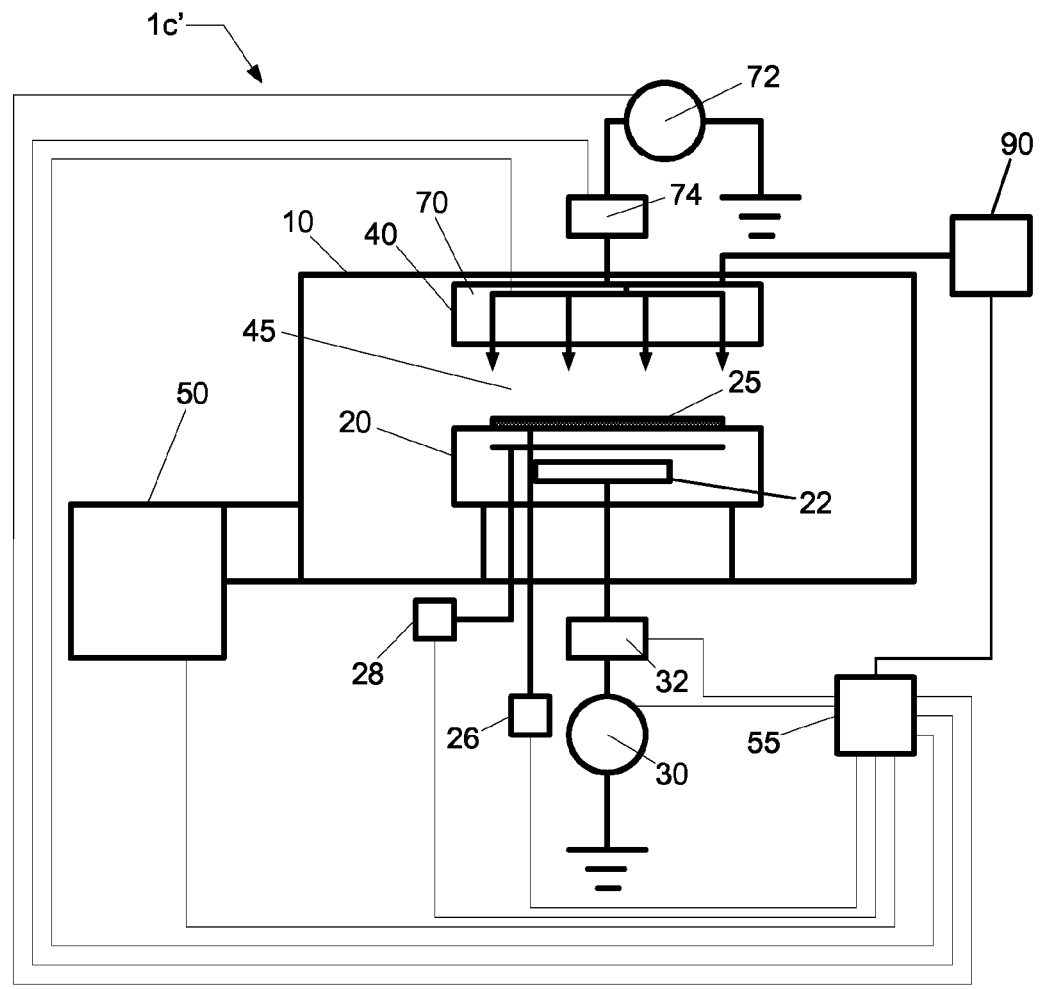
FIG. 8 shows a schematic representation of a plasma etching system according to another embodiment.

In the embodiment shown in FIG. 8, plasma etching system 1c' can be similar to the embodiment of FIG. 7, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 9:
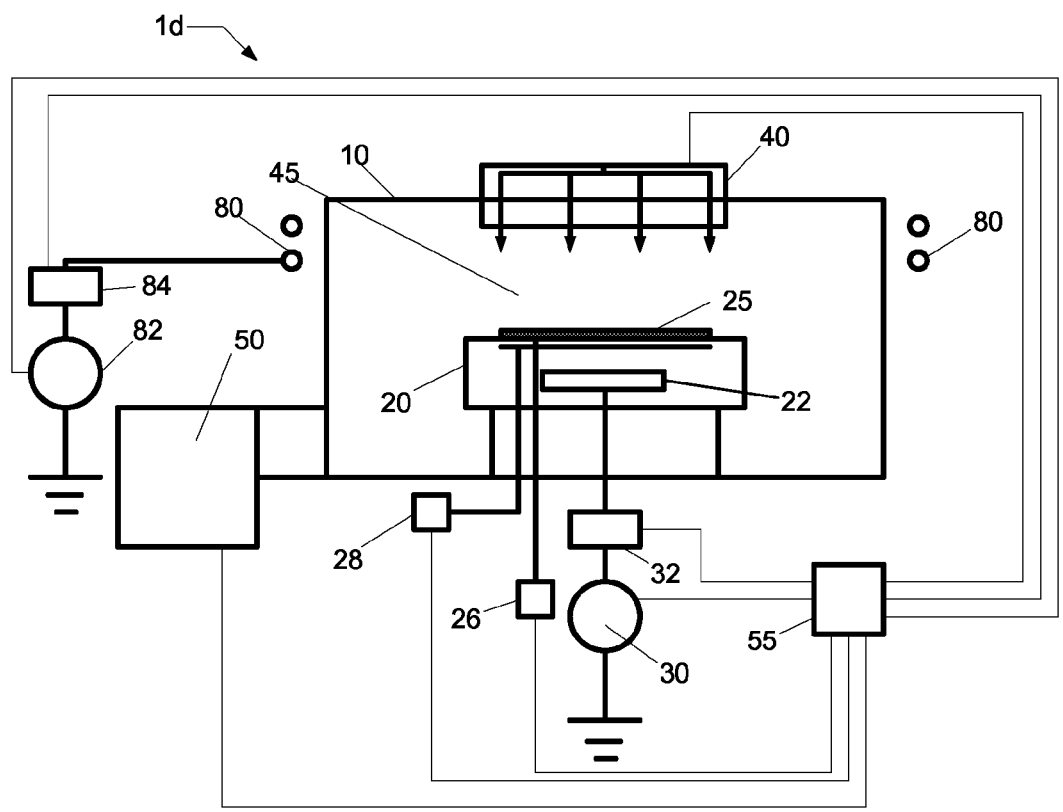
FIG. 9 shows a schematic representation of a plasma etching system according to another embodiment.

In the embodiment shown in FIG. 9, plasma etching system 1d can be similar to the embodiments of FIGS. 5 and 6, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

In an alternate embodiment, as shown in FIG. 10, plasma etching system 1e can be similar to the embodiment of FIG. 9, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
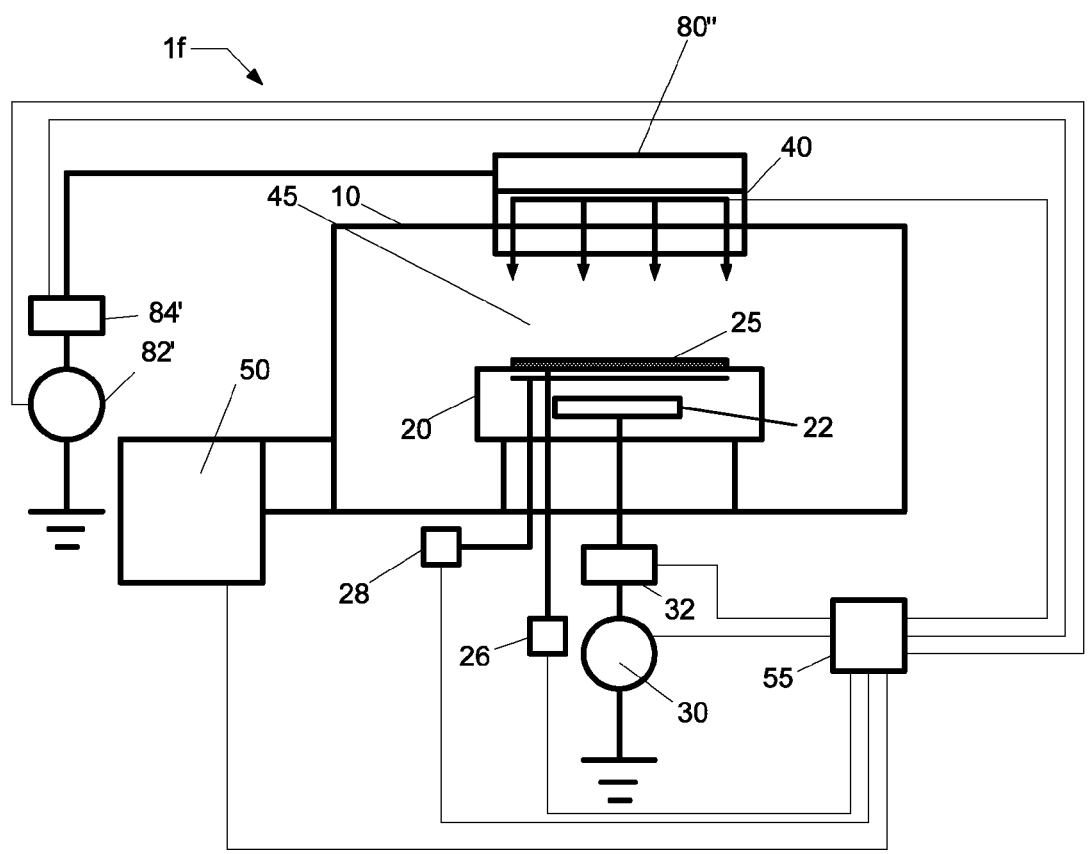
FIG. 11 shows a schematic representation of a plasma etching system according to another embodiment.

In the embodiment shown in FIG. 11, plasma etching system 1f can be similar to the embodiment of FIG. 5, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

Figure 12:
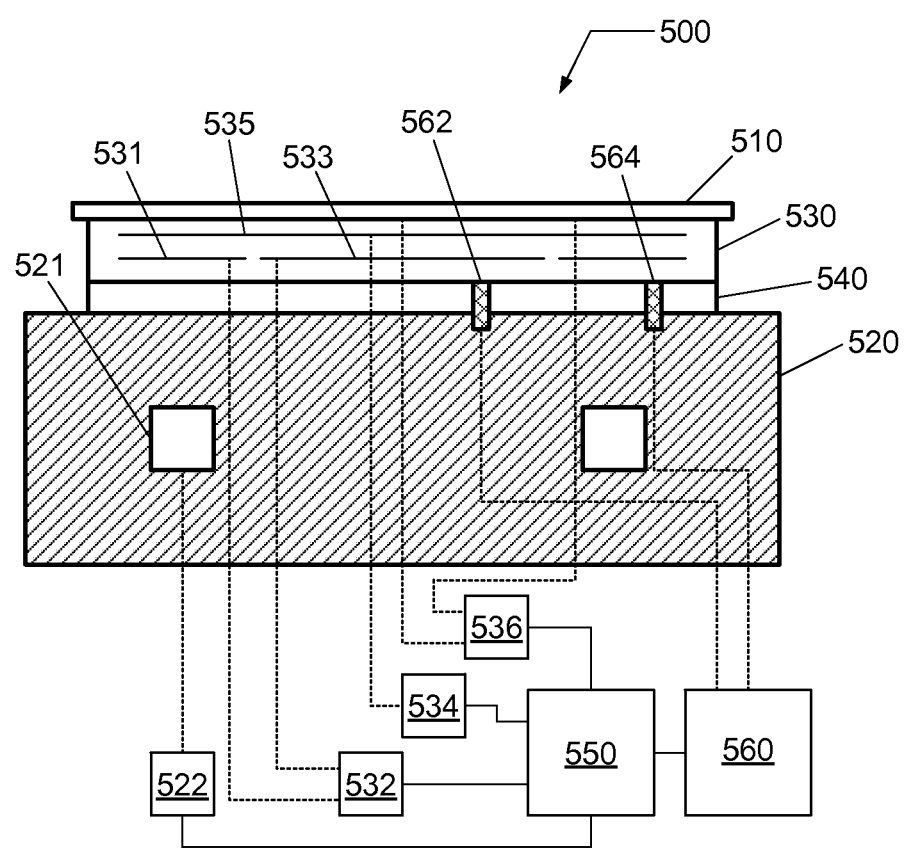
FIG. 12 shows a schematic representation of a substrate holder for use in a plasma etching system according to yet another embodiment.

Referring now to FIG. 12, a temperature controlled substrate holder 500 for use in any one of the plasma etching systems depicted in FIGS. 5 through 11 is described according to yet another embodiment. The substrate holder 500 comprises a substrate support 530 having a first temperature and configured to support a substrate 510, a temperature-controlled support base 520 positioned below substrate support 530 and configured to be at a second temperature less than the first temperature (e.g. less than a desired temperature of substrate 510), and a thermal insulator 540 disposed between the substrate support 530 and the temperature-controlled support base 520. Additionally, the substrate support 530 comprises a center heating element 533 (located at a substantially center region below substrate 510) and an edge heating element 531 (located at a substantially edge, or peripheral, region below substrate 510) coupled thereto, and configured to elevate the temperature of the substrate support 530. Furthermore, the support base 520 comprises one or more cooling elements 521 coupled thereto, and configured to reduce the temperature of the substrate support 530 via the removal of heat from the substrate support 530 through thermal insulator 540.

As shown in FIG. 12, the center heating element 533 and the edge heating element 531 are coupled to a heating element control unit 532. Heating element control unit 532 is configured to provide either dependent or independent control of each heating element, and exchange information with a controller 550. The center heating element 533 and the edge heating element 531 may comprise at least one of a heating fluid channel, a resistive heating element, or a thermo-electric element biased to transfer heat towards the wafer.

For example, the center heating element 533 and the edge heating element 531 may comprise one or more heating channels that can permit flow of a fluid, such as water, FLUORINERT, GALDEN HT-135, etc., there through in order to provide conductive-convective heating, wherein the fluid temperature has been elevated via a heat exchanger. The fluid flow rate and fluid temperature can, for example, be set, monitored, adjusted, and controlled by the heating element control unit 532.

Alternatively, for example, the center heating element 533 and the edge heating element 531 may comprise one or more resistive heating elements such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, CT. The Kanthal family includes ferritic alloys (FeCrAl) and the Nikrothal family includes austenitic alloys (NiCr, NiCrFe). For example, the heating elements can comprise a cast-in heater commercially available from Watlow (1310 Kingsland Dr., Batavia, IL, 60510) capable of a maximum operating temperature of 400 to 450 degrees C., or a film heater comprising aluminum nitride materials that is also commercially available from Watlow and capable of operating temperatures as high as 300° C. and power densities of up to 23.25 W/cm². Additionally, for example, the heating element can comprise a silicone rubber heater (1.0 mm thick) capable of power of 1400 W (or power density of 5 W/in²). When an electrical current flows through the filament, power is dissipated as heat, and, therefore, the heating element control unit 532 can, for example, comprise a controllable DC power supply. A further heater option, suitable for lower temperatures and power densities, are Kapton heaters, consisted of a filament embedded in a Kapton (e.g. polyimide) sheet, marketed by Minco, Inc., of Minneapolis, MN.

Alternately, for example, the center heating element 533 and the edge heating element 531 can comprise an array of thermo-electric elements capable of heating or cooling a substrate depending upon the direction of electrical current flow through the respective elements. Thus, while the center heating element 533 and the edge heating element 531 are referred to as "heating elements," these elements may include the capability of cooling in order to provide rapid transition between temperatures. Further, heating and cooling functions may be provided by separate elements within the substrate support 530. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the heating element control unit 532 can, for example, comprise a controllable current source.

The one or more cooling elements 521 can comprise at least one of a cooling channel, or a thermo-electric element. Furthermore, as shown in FIG. 12, the one or more cooling elements 521 are coupled to a cooling element control unit 522. Cooling element control unit 522 is configured to provide dependent or independent control of each cooling element 521, and exchange information with controller 550.

For example, the one or more cooling elements 521 can comprise one or more cooling channels that can permit flow of a fluid, such as water, FLUORINERT, GALDEN HT-135, etc., there through in order to provide conductive-convective cooling, wherein the fluid temperature has been lowered via a heat exchanger. The fluid flow rate and fluid temperature can, for example, be set, monitored, adjusted, and controlled by the cooling element control unit 522. Alternately, during heating for example, the fluid temperature of the fluid flow through the one or more cooling elements 521 may be increased to complement the heating by the center heating element 533 and the edge heating element 531. Alternately yet, during cooling for example, the fluid temperature of the fluid flow through the one or more cooling elements 521 may be decreased.

Alternately, for example, the one or more cooling elements 521 can comprise an array of thermo-electric elements capable of heating or cooling a substrate depending upon the direction of electrical current flow through the respective elements. Thus, while the elements 521 are referred to as "cooling elements," these elements may include the capability of heating in order to provide rapid transition between temperatures. Further, heating and cooling function may be provided by separate elements within the temperature controlled support base 520. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the cooling element control unit 522 can, for example, comprise a controllable current source.

Additionally, as shown in FIG. 12, the substrate holder 500 may further comprise an electrostatic clamp (ESC) comprising one or more clamping electrodes 535 embedded within substrate support 530. The ESC further comprises a high-voltage (HV) DC voltage supply 534 coupled to the clamping electrodes 535 via an electrical connection. The design and implementation of such a clamp is well known to those skilled in the art of electrostatic clamping systems. Furthermore, the HV DC voltage supply 534 is coupled to controller 550 and is configured to exchange information with controller 550.

Furthermore, as shown in FIG. 12, the substrate holder 500 can further comprise a back-side gas supply system 536 for supplying a heat transfer gas, such as an inert gas including helium, argon, xenon, krypton, a process gas, or other gas including oxygen, nitrogen, or hydrogen, to the center region and the edge region of the backside of substrate 510 through two gas supply lines, and at least two of a plurality of orifices and channels (not shown). The backside gas supply system 536, as shown, comprises a two-zone (center/edge) system, wherein the backside pressure can be varied in a radial direction from the center to edge. Furthermore, the backside gas supply system 536 is coupled to controller 550 and is configured to exchange information with controller 550.

Further yet, as shown in FIG. 12, the substrate holder 500 further comprises a center temperature sensor 562 for measuring a temperature at a substantially center region below substrate 510 and an edge temperature sensor 564 for measuring a temperature at a substantially edge region below substrate 510. The center and edge temperature sensors 562, 564 are coupled to a temperature monitoring system 560.

The temperature sensor can include an optical fiber thermometer, an optical pyrometer, a band-edge temperature measurement system as described in U.S. Pat. No. 6,891,124, the contents of which are incorporated herein by reference in their entirety, or a thermocouple (as indicated by the dashed line) such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

The temperature monitoring system 560 may provide sensor information to controller 550 in order to adjust at least one of a heating element, a cooling element, a backside gas supply system, or an HV DC voltage supply for an ESC before, during, or after processing.

Controller 550 includes a microprocessor, memory, and a digital I/O port (potentially including D/A and/or A/D converters) capable of generating control voltages sufficient to communicate and activate inputs to substrate holder 500 as well as monitor outputs from substrate holder 500. As shown in FIG. 12, controller 550 can be coupled to and exchange information with heating element control unit 532, cooling element control unit 522, HV DC voltage supply 534, backside gas supply system 536, and temperature monitoring system 560. A program stored in the memory is utilized to interact with the aforementioned components of substrate holder 500 according to a stored process recipe.

The controller 550 may also be implemented as a general purpose computer, processor, digital signal processor, etc., which causes a substrate holder to perform a portion or all of the processing steps of the invention in response to the controller 550 executing one or more sequences of one or more instructions contained in a computer readable medium. The computer readable medium or memory is configured to hold instructions programmed according to the teachings of the invention and can contain data structures, tables, records, or other data described herein. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 550 may be locally located relative to the substrate holder 500, or it may be remotely located relative to the substrate holder 500 via an internet or intranet. Thus, controller 550 can exchange data with the substrate holder 500 using at least one of a direct connection, an intranet, or the internet. Controller 550 may be coupled to an intranet at a customer site (i.e., a device maker, etc.), or coupled to an intranet at a vendor site (i.e., an equipment manufacturer). Furthermore, another computer (i.e., controller, server, etc.) can access controller 550 to exchange data via at least one of a direct connection, an intranet, or the internet.

Optionally, substrate holder 500 can include an electrode through which RF power is coupled to plasma in a processing region above substrate 510. For example, support base 520 can be electrically biased at an RF voltage via the transmission of RF power from an RF generator through an impedance match network to substrate holder 500. The RF bias can serve to heat electrons to form and maintain plasma, or bias substrate 510 in order to control ion energy incident on substrate 510, or both. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, an impedance match network can serve to maximize the transfer of RF power to plasma in the processing chamber by minimizing the reflected power. Various match network topologies (e.g., L-type, π-type, T-type, etc.) and automatic control methods can be utilized.

Additional details for the design of a temperature controlled substrate holder configured for rapid and uniform control of substrate temperature are provided in U.S. Patent Application Publication No. 2008/0083723; U.S. Patent Application Publication No. 2010/0078424; U.S. Patent Application Publication No. 2008/0083724; U.S. Patent Application Publication No. 2008/0073335; U.S. Pat. No. 7,297,894; U.S. Pat. No. 7,557,328; and U.S. Patent Application Publication No. 2009/0266809.

In one embodiment, the first, second, and/or third etch process may comprise a process parameter space that includes: a chamber pressure ranging up to about 1000 mTorr (milli-Ton) (e.g., up to about 100 mTorr, or up to about 10 to 30 mTorr), a process gas flow rate ranging up to about 2000 sccm (standard cubic centimeters per minute) (e.g., up to about 1000 sccm, or about 1 sccm to about 100 sccm, or about 1 sccm to about 20 sccm, or about 15 sccm), an additive gas flow rate ranging up to about 2000 sccm (e.g., up to about 1000 sccm, or about 1 sccm to about 20 sccm, or about 10 sccm), an upper electrode (e.g., element 70 in FIG. 7) RF bias ranging up to about 2000 W (watts) (e.g., up to about 1000 W, or up to about 500 W), and a lower electrode (e.g., element 22 in FIG. 7) RF bias ranging up to about 1000 W (e.g., up to about 600 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another alternate embodiment, RF power is supplied to the upper electrode and not the lower electrode. In another alternate embodiment, RF power is supplied to the lower electrode and not the upper electrode. In alternate embodiments. RF power and/or DC power may be coupled in any of the manners described in FIGS. 5 through 11.

The time duration to perform a specific etch process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with endpoint detection.

One or more of the etch processes described above may be performed utilizing a plasma etching system such as the one described in FIGS. 5 through 11. Furthermore, one or more of the etch processes described above may be performed utilizing a temperature controlled substrate holder in a plasma etching system such as the one described in FIG. 12. However, the methods discussed are not to be limited in scope by this exemplary presentation.

As noted above, the present inventors discovered that using a substrate temperature control scheme when patterning an insulation stack using a plurality of etch processes can achieve acceptable etch selectivity between layers, and acceptable profile control and CD control, among other things. For example, at a relatively low substrate temperature, an etch process can achieve CD control, particularly, when forming the via pattern. However, at relatively high substrate temperature, etch selectivity between the insulation layer and the cap layer can be achieved. With the temperature controlled substrate holder described in FIG. 12, rapid, uniform temperature control may be achieved between etch processes, thus, making the implementation of a substrate temperature control scheme practical.

Table 1 provides an exemplary process condition for patterning a cap layer underlying a silicon-containing ARC layer and an organic planarization layer (OPL). The cap layer includes $SiC_xN_yH_z$-based material. For each etch process, a process condition is recited including a process no., an upper electrode (UEL) power (watts, W), a lower electrode (LEL) power (watts, W), a gas pressure (milli-Torr, mTorr) in the plasma etching system, a temperature set for components in the plasma etching system (° C.) ("UEL"=Upper electrode temperature; "W"=Wall temperature; "LEL"=Lower electrode temperature, i.e., substrate temperature), a $C_4F_8$ flow rate (standard cubic centimeters per minute, sccm), an Ar flow rate, an $N_2$ flow rate, and etch time (sec, seconds).

Once a via pattern is extended through the ARC layer and OPL layer, the process conditions identified in Table 1 are executed. The difference between processes no. 1 and 2 is substrate temperature, wherein the temperature is elevated from 8 degrees C. to 60 degrees C. As noted in Table 1, the via pattern is extended into or through the cap layer using the above identified process condition at relatively low substrate temperature, while it is not extended into or through the cap layer using the above identified process condition at relatively high substrate temperature.

Although only certain embodiments of this invention have been described in detail above, those skilled in the art will readily appreciate that many modifications are possible in the embodiments without materially departing from the novel teachings and advantages of this invention. For example, although one exemplary process flow is provided for preparing a metal gate structure, other process flows are contemplated. Accordingly, all such modifications are intended to be included within the scope of this invention.

The invention claimed is:

1. A method of patterning an insulation layer, comprising:
preparing a film stack on a substrate, said film stack comprising a cap layer, a SiCOH-containing layer overlying said cap layer, and a hard mask overlying said SiCOH-containing layer; and
transferring a pattern through said film stack by performing a series of etch processes in a plasma etching system, wherein said series of etch processes utilize a temperature controlled substrate holder in said plasma etching system according to a substrate temperature control scheme that achieves etch selectivity between said SiCOH-containing layer and said underlying cap layer, said substrate temperature control scheme including:
controlling a first substrate temperature in a first etch process for transferring said pattern through said hard mask and optionally for partially transferring said pattern to said SiCOH-containing layer,
controlling a second substrate temperature at a temperature greater than said first substrate temperature in a second etch process for transferring said pattern through said SiCOH-containing layer, and
controlling a third substrate temperature at a temperature less than said second substrate temperature in a third etch process for transferring said pattern through said cap layer,
wherein said hard mask comprises at least one layer containing Si and O, or at least one layer containing a metal.

2. The method of claim 1, wherein said substrate temperature control scheme comprises:
controlling said first substrate temperature at a temperature less than about 20 degrees C. in said first etch process;
controlling said second substrate temperature at a temperature greater than about 50 degrees C. in said second etch process; and
controlling said third substrate temperature at a temperature less than about 20 degrees C. in said third etch process.

TABLE 1

| Process Description | Process No. | UEL RF (W) | LEL RF (W) | p (mTorr) | T (° C.) (UEL, W, LEL) | $C_4F_8$ (sccm) | Ar (sccm) | $N_2$ (sccm) | Etch time (sec) | Via pattern extends into/through cap layer |
|---|---|---|---|---|---|---|---|---|---|---|
| Via patterning of cap layer | 1 | 800 | 1200 | 40 | 60, 60, 8 | 10 | 500 | 100 | 20 | Observed |
| | 2 | 800 | 1200 | 40 | 60, 60, 60 | 10 | 500 | 100 | 20 | Not observed |

3. The method of claim 1, wherein said transferring said pattern is incorporated within a trench-first-metal-hard-mask (TFMHM) integration scheme, or a via-first-trench-last (VFTL) integration scheme.

4. The method of claim 1, wherein said film stack comprises a graded layer disposed between said SiCOH-containing layer and said cap layer.

5. The method of claim 4, wherein said graded layer comprises a layer containing Si and one or more elements selected from the group consisting of O, C, and N.

6. The method of claim 1, wherein said hard mask comprises multiple layers.

7. The method of claim 1, wherein said cap layer comprises multiple layers.

8. The method of claim 1, wherein said cap layer comprise silicon nitride ($Si_xN_y$), silicon carbide ($Si_xC_y$), silicon carbonitride ($SiC_xN_y$), or $SiC_xN_yH_z$, or a combination of two or more thereof.

9. The method of claim 1, wherein said SiCOH-containing layer is formed using a vapor deposition process.

10. The method of claim 1, wherein said preparing said film stack further comprises:
    forming a mask overlying said hard mask, said mask including a layer of radiation-sensitive material overlying an anti-reflective coating (ARC); and
    forming said pattern in said mask using a lithographic technique.

11. The method of claim 1, wherein said temperature controlled substrate holder comprises:
    a support base having fluid channels to circulate a temperature controlled thermal fluid in said support base; and
    a substrate support coupled via a thermal insulator to an upper portion of said support base, said substrate support comprising:
        one or more heating elements embedded within said substrate support,
        an upper surface to support said substrate by contact between said upper surface and a backside of said substrate, and
        an electrostatic clamp electrode to hold said substrate on said upper surface of said substrate support.

12. The method of claim 11, wherein said temperature controlled substrate holder further comprises:
    a backside gas supply system configured to supply a heat transfer gas to the backside of said substrate through at least one of a plurality of orifices or channels disposed on said upper surface of said substrate support.

13. The method of claim 12, wherein said plurality of orifices of said backside gas supply system are arranged in a plurality of zones on said upper surface of said substrate support to vary a backside pressure in a radial direction between a substantially central region of the backside of said substrate and a substantially edge region of the backside of said substrate.

14. The method of claim 11, wherein said series of etch processes comprise:
    maintaining said substrate at a first temperature profile during said first etch process by controlling said substrate support at a first set-point temperature comprising a first inner set-point temperature corresponding to a substantially central region of said substrate and a first outer set-point temperature corresponding to a substantially edge region of said substrate and controlling said support base at a first base temperature;
    adjusting said substrate from said first temperature profile to a second temperature profile following said first etch process and preceding said second etch process;
    maintaining said substrate at said second temperature profile during said second etch process by controlling said substrate support at a second set-point temperature comprising a second inner set-point temperature and a second outer set-point temperature, said second inner set-point temperature and said second outer set-point temperature being different than said first inner set-point temperature and said first outer set-point temperature and controlling said support base at a second base temperature;
    adjusting said substrate from said second temperature profile to a third temperature profile following said second etch process and preceding said third etch process; and
    maintaining said substrate at said third temperature profile during said third etch process by controlling said substrate support at a third set-point temperature comprising a third inner set-point temperature and a third outer set-point temperature, said third inner set-point temperature and said third outer set-point temperature being different than said second inner set-point temperature and said second outer set-point temperature and controlling said support base at a third base temperature.

15. A method of preparing a trench-via structure on a substrate, comprising:
    preparing a film stack on a substrate, said film stack comprising a cap layer, a SiCOH-containing layer overlying said cap layer, and a hard mask overlying said SiCOH-containing layer;
    forming a trench pattern in said hard mask;
    preparing a via patterning layer overlying said hard mask with a via pattern aligned with said trench pattern;
    at least partially transferring said via pattern in said via patterning layer to said SiCOH-containing layer using a first etch process in a plasma etching system;
    removing said via patterning layer;
    transferring said trench pattern in said hard mask to said SiCOH-containing layer using a second etch process in said plasma etching system while not penetrating said cap layer;
    transferring said via pattern in said SiCOH-containing layer to said cap layer using a third etch process in said plasma etching system; and
    utilizing a temperature controlled substrate holder in said plasma etching system according to a substrate temperature control scheme to achieve etch selectivity between said SiCOH-containing layer and said cap layer during said transferring of said trench pattern, said substrate temperature control scheme including:
    controlling a first substrate temperature in said first etch process for transferring said via pattern to said SiCOH-containing layer,
    controlling a second substrate temperature at a temperature greater than said first substrate temperature in said second etch process for transferring said trench pattern to said SiCOH-containing layer, and
    controlling a third substrate temperature at a temperature less than said second substrate temperature in said third etch process for transferring said via pattern to said cap layer,
    wherein said hard mask comprises at least one layer containing Si and O, or at least one layer containing a metal.

16. The method of claim 15, wherein said substrate temperature control scheme comprises:
    controlling said first substrate temperature at a temperature less than about 20 degrees C. in said first etch process;
    controlling said second substrate temperature at a temperature greater than about 50 degrees C. in said second etch process; and
    controlling said third substrate temperature at a temperature less than about 20 degrees C. in said third etch process.

17. The method of claim 15, further comprising:
disposing a graded layer between said SiCOH-containing layer and said cap layer; and
transferring said via pattern to said graded layer.

18. The method of claim 15, wherein said hard mask comprises a metal-containing layer, and said cap layer comprises silicon nitride ($Si_xN_y$), silicon carbide ($Si_xC_y$), silicon carbonitride ($SiC_xN_y$), or $SiC_xN_yH_z$, or a combination of two or more thereof.

19. A method of preparing a trench-via structure on a substrate, comprising:
preparing a film stack on a substrate, said film stack comprising a cap layer, a SiCOH-containing layer overlying said cap layer, and a hard mask overlying said SiCOH-containing layer;
forming a via pattern in said hard mask;
at least partially transferring said via pattern in said hard mask to said SiCOH-containing layer using a first etch process in a plasma etching system;
preparing a trench patterning layer overlying said hard mask with a trench pattern aligned with said via pattern;
transferring said trench pattern to said hard mask;
removing said trench patterning layer;
transferring said trench pattern in said hard mask to said SiCOH-containing layer using a second etch process in said plasma etching system while not penetrating said cap layer;
transferring said via pattern in said SiCOH-containing layer to said cap layer using a third etch process in said plasma etching system; and
utilizing a temperature controlled substrate holder in said plasma etching system according to a substrate temperature control scheme to achieve etch selectivity between said SiCOH-containing layer and said cap layer during said transferring of said trench pattern, said substrate temperature control scheme including:
controlling a first substrate temperature in said first etch process for transferring said via pattern to said SiCOH-containing layer,
controlling a second substrate temperature at a temperature greater than said first substrate temperature in said second etch process for transferring said trench pattern to said SiCOH-containing layer, and
controlling a third substrate temperature at a temperature less than said second substrate temperature in said third etch process for transferring said via pattern to said cap layer,
wherein said hard mask comprises at least one layer containing Si and O, or at least one layer containing a metal.

* * * * *